(12) United States Patent
Chen et al.

(10) Patent No.: US 12,451,390 B2
(45) Date of Patent: *Oct. 21, 2025

(54) TRENCH FILLING THROUGH REFLOWING FILLING MATERIAL

(71) Applicant: Taiwan Semiconductor Manufacturing Co., Ltd., Hsinchu (TW)

(72) Inventors: Wen-Yen Chen, Hsinchu (TW); Li-Ting Wang, Hsinchu (TW); Wan-Chen Hsieh, Hsinchu (TW); Bo-Cyuan Lu, New Taipei (TW); Tai-Chun Huang, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/182,485

(22) Filed: Mar. 13, 2023

(65) Prior Publication Data

US 2023/0215758 A1 Jul. 6, 2023

Related U.S. Application Data

(63) Continuation of application No. 16/939,718, filed on Jul. 27, 2020, now Pat. No. 11,605,555.

(Continued)

(51) Int. Cl.
*H01L 21/762* (2006.01)
*H01L 21/02* (2006.01)
(Continued)

(52) U.S. Cl.
CPC .. *H01L 21/76224* (2013.01); *H01L 21/02532* (2013.01); *H01L 21/764* (2013.01); *H01L 21/7684* (2013.01); *H01L 21/76882* (2013.01)

(58) Field of Classification Search
CPC ......... H01L 21/76224; H01L 21/02532; H01L 21/764; H01L 21/7684; H01L 21/76882;
(Continued)

(56) References Cited

U.S. PATENT DOCUMENTS 11,855,146 B2 12/2023 Liu et al.
2005/0019997 A1* 1/2005 Kusumoto ........ H01L 21/02686
438/166

(Continued)

FOREIGN PATENT DOCUMENTS

CN 110783274 A 2/2020
TW 202008468 A 2/2020

*Primary Examiner* — Julia Slutsker
(74) *Attorney, Agent, or Firm* — Slater Matsil, LLP

(57) ABSTRACT

A method includes forming a first protruding fin and a second protruding fin over a base structure, with a trench located between the first protruding fin and the second protruding fin, depositing a trench-filling material extending into the trench, and performing a laser reflow process on the trench-filling material. In the reflow process, the trench-filling material has a temperature higher than a first melting point of the trench-filling material, and lower than a second melting point of the first protruding fin and the second protruding fin. After the laser reflow process, the trench-filling material is solidified. The method further includes patterning the trench-filling material, with a remaining portion of the trench-filling material forming a part of a gate stack, and forming a source/drain region on a side of the gate stack.

20 Claims, 20 Drawing Sheets

Related U.S. Application Data

(60) Provisional application No. 63/010,916, filed on Apr. 16, 2020.

(51) Int. Cl.
*H01L 21/764* (2006.01)
*H01L 21/768* (2006.01)

(58) Field of Classification Search
CPC ........... H01L 21/02675; H01L 21/0245; H01L 21/32055; H10D 84/0158; H10D 30/024; H10D 64/017; H10D 84/038; H10D 30/62; H10D 84/0135
See application file for complete search history.

(56) References Cited

U.S. PATENT DOCUMENTS

| | | |
|---|---|---|
| 2008/0090388 A1* | 4/2008 | Sato .................. H01L 21/02691 438/479 |
| 2016/0293697 A1 | 10/2016 | Kim et al. |
| 2017/0033178 A1* | 2/2017 | Krishnan .......... H01L 29/66545 |
| 2018/0096898 A1* | 4/2018 | Yu ........................ H01L 21/3247 |
| 2019/0319113 A1 | 10/2019 | Yu et al. |
| 2020/0035784 A1 | 1/2020 | Lee et al. |
| 2020/0044025 A1 | 2/2020 | Liu et al. |
| 2020/0083112 A1 | 3/2020 | Yu et al. |
| 2021/0043519 A1* | 2/2021 | Fulford .............. H10D 84/0167 |

\* cited by examiner

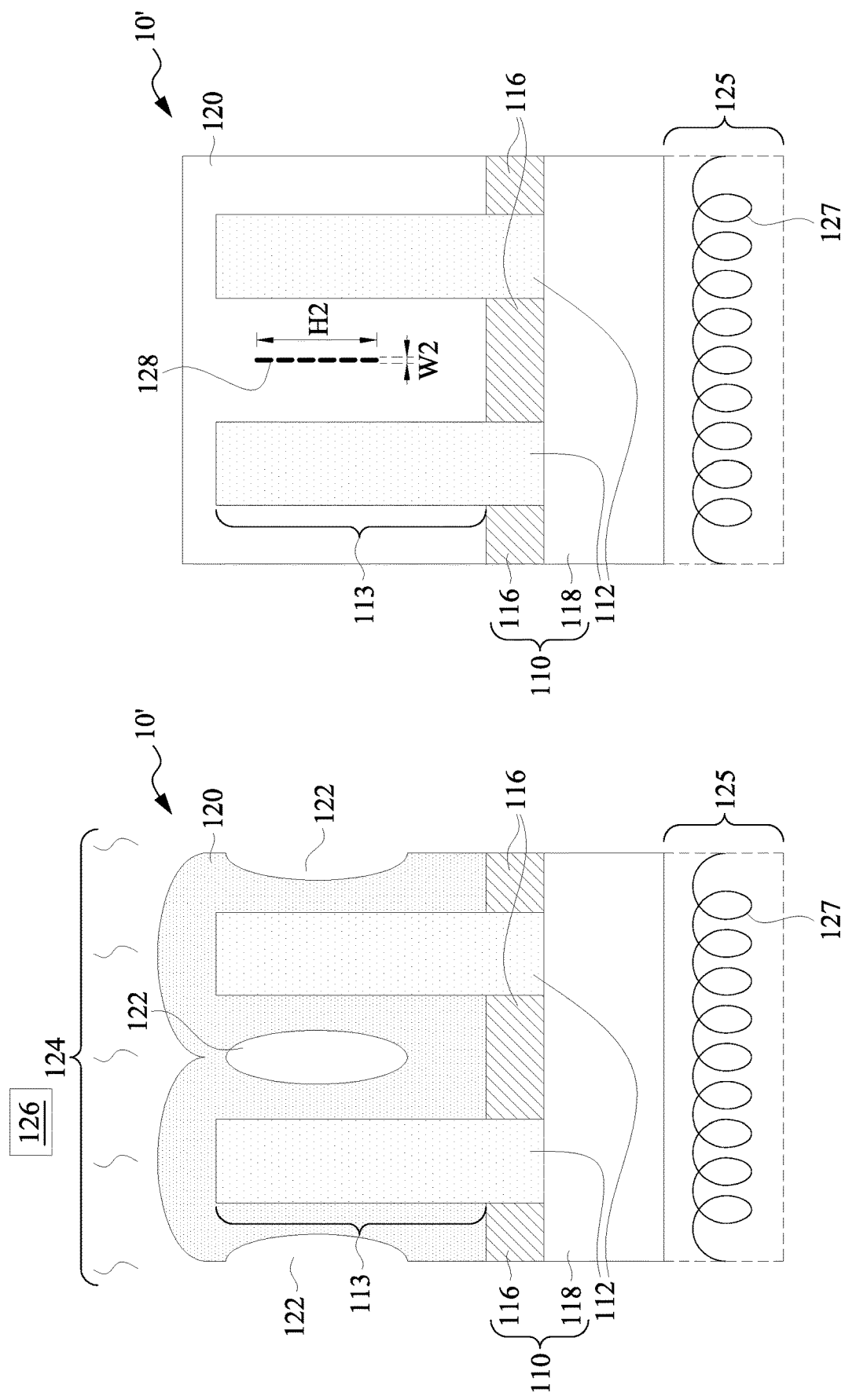

TRENCH FILLING THROUGH REFLOWING FILLING MATERIAL

PRIORITY CLAIM AND CROSS-REFERENCE

This application is a continuation of U.S. patent application Ser. No. 16/939,718, filed Jul. 27, 2020, and entitled "Trench Filling Through Reflowing Filling Material," which claims the benefit of the U.S. Provisional Application No. 63/010,916, filed Apr. 16, 2020, and entitled "High Aspect Ratio Trench Fill by Using Low Melting Point Material with Locally Heating for Seam Free," which applications are hereby incorporated herein by reference.

BACKGROUND

In the fabrication of integrated circuits, there is a need of filling narrow trenches having aspect ratios greater than 2 without generating voids. One of the situations is to form dummy gates, which includes forming an amorphous silicon layer, which is filled into the trenches between semiconductor fins. For this application, the entire amorphous silicon layer needs to have high quality and void-free to prevent problems that may occur during the subsequent post-gate-cut and spacer-deposition processes. Conventionally, chemical vapor deposition is used to form amorphous silicon layers. The resulting amorphous silicon layers, however, have mushroom-shaped portions on top of narrow trenches. This is due to the inability of the reaction vapor to penetrate into the deep trenches. As a result, voids are formed in amorphous silicon and extending into the trenches.

Conventionally, to avoid the generation of the voids, several methods were used. For example, bottom-up gap filling methods may be used. The bottom-up gap filling methods, however, requires reactants that have very high selectivity. Annealing process may also be used. The annealing process, however, requires temperatures higher than the original thermal budget. Deposition-and-etching cycles may also be used to reduce void/seam width and length. This process, however, is costly and time consuming, and cannot fully remove the voids.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 16 through 19 illustrate the cross-sectional views of intermediate stages in the formation of a trench-filling process in accordance with some embodiments.

DETAILED DESCRIPTION

Figure 1:
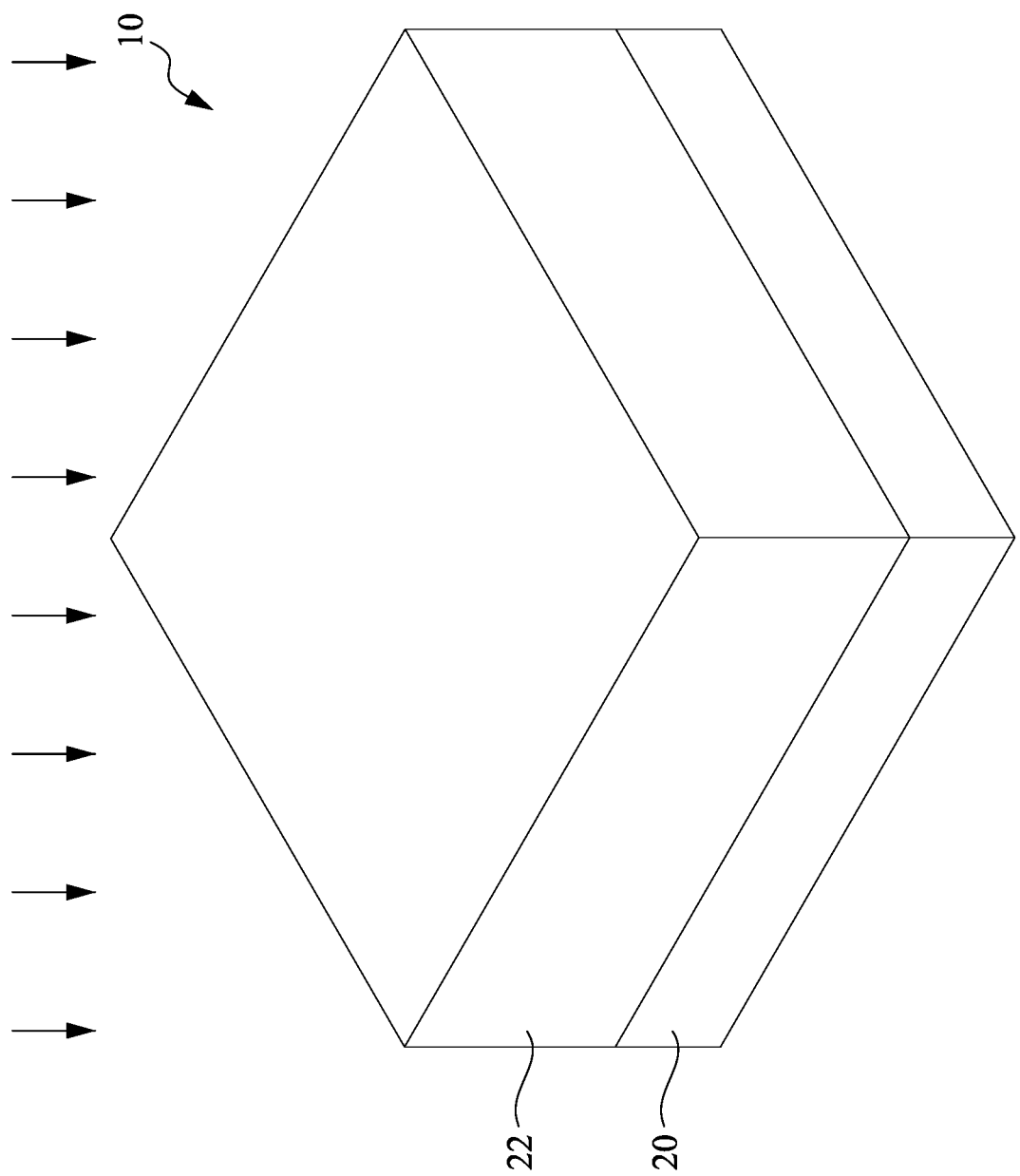
FIGS. 1 through 15 illustrate perspective views and cross-sectional views of intermediate stages in the formation of a Fin Field-Effect Transistor (FinFET) and a corresponding trench-filling process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trench-filling process and a process of forming a Fin Field-Effect Transistor (FinFET) using the trench-filling process are provided in accordance with some embodiments. In accordance with some embodiments of the present disclosure, the trench-filling process includes depositing a trench-filling material into trenches, and performing an annealing process to reflow the trench-filling material in order to reduce or eliminate the voids in the trenches. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 15 illustrate the cross-sectional views of intermediate stages in the formation of a FinFET in accordance with some embodiments of the present disclosure. The corresponding processes are also reflected schematically in the process flow shown in FIG. 23.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 23:
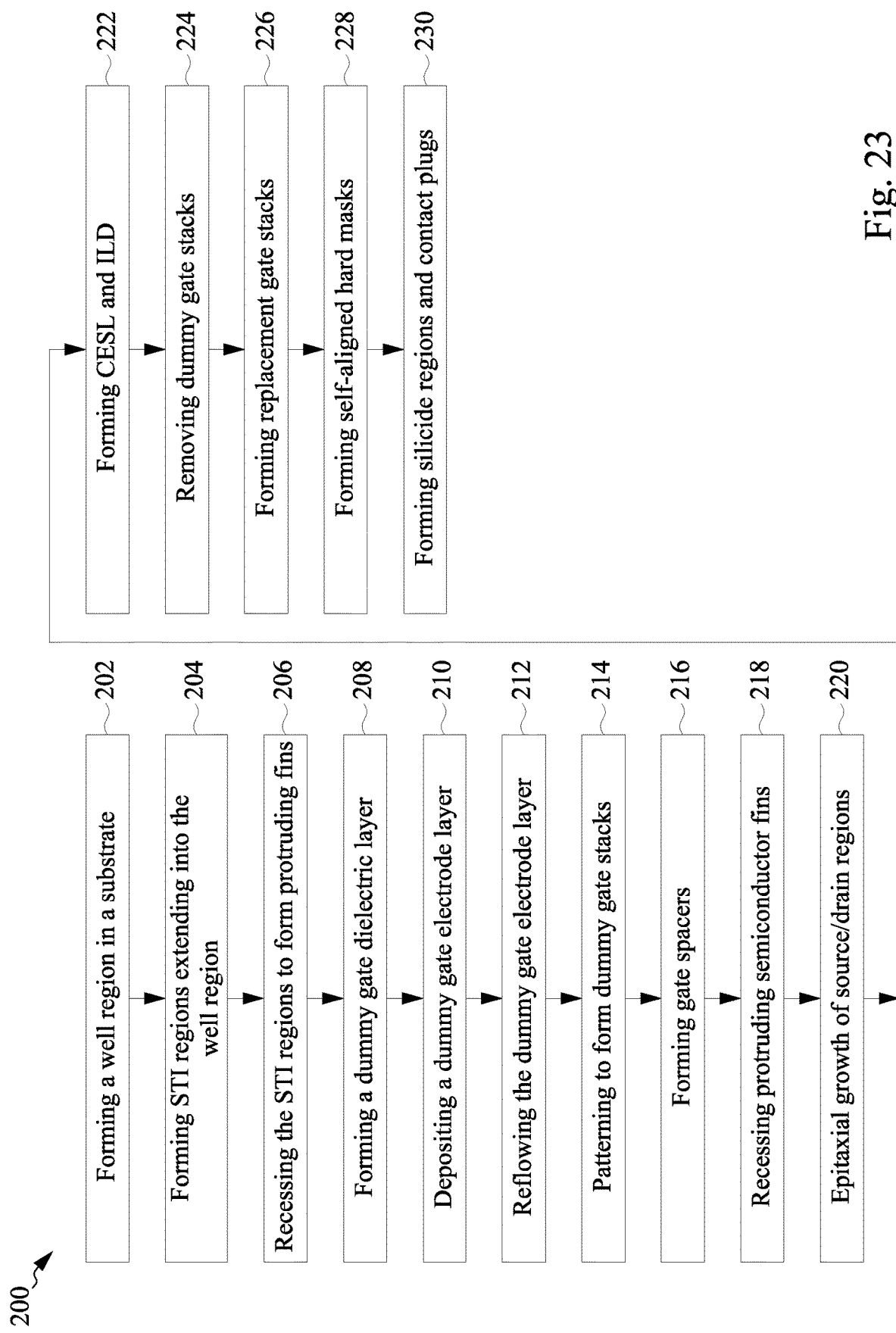
FIG. 23 illustrates a process flow for forming a FinFET in accordance with some embodiments.

Further referring to FIG. 1, well region 22 is formed in substrate 20. The respective process is illustrated as process 202 in the process flow 200 as shown in FIG. 23. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
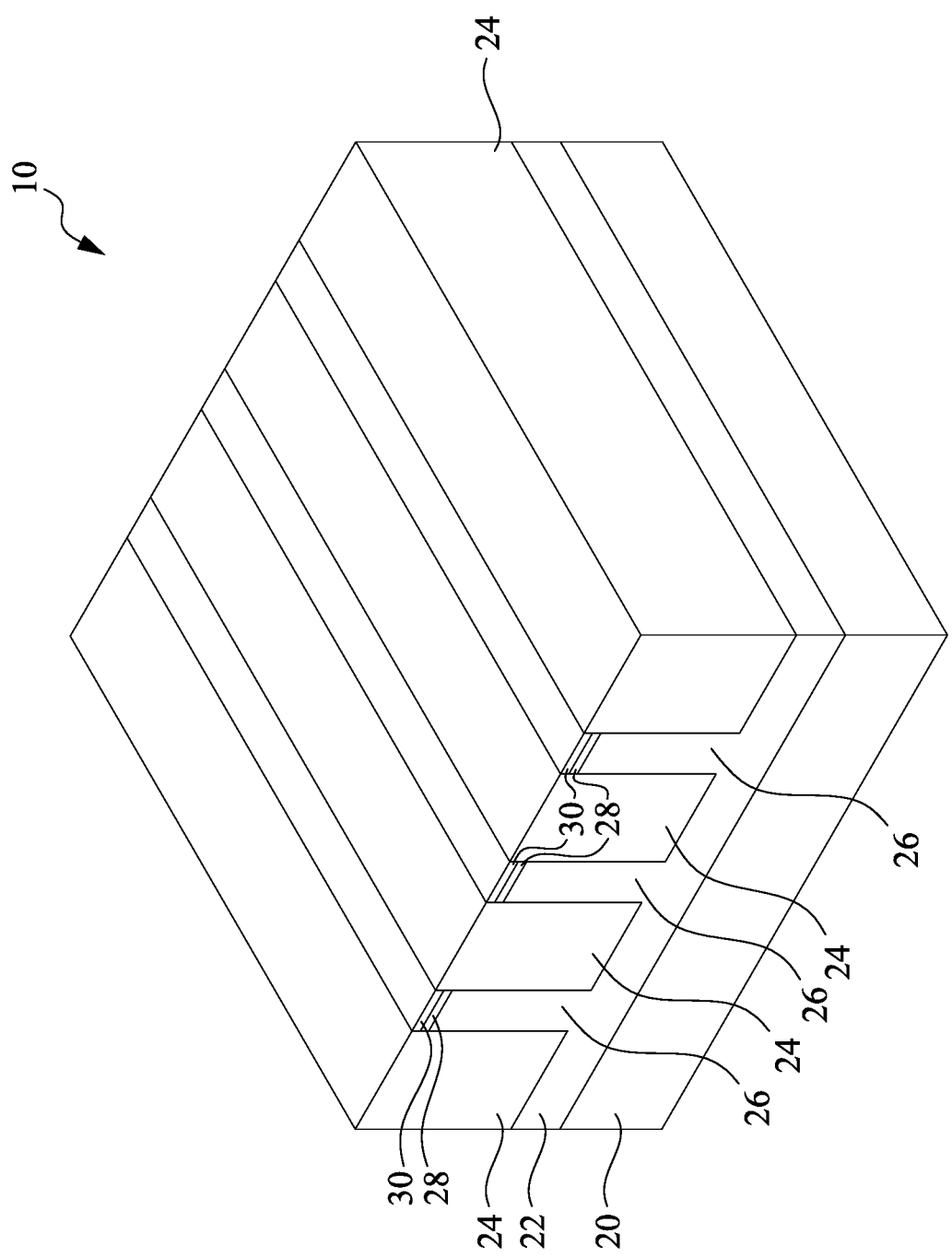

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 as shown in FIG. 23. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Atomic Layer Deposition (ALD), Low-Pressure Chemical Vapor Deposition (LPCVD), Plasma Enhanced Chemical Vapor Deposition (PECVD), or the like. A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
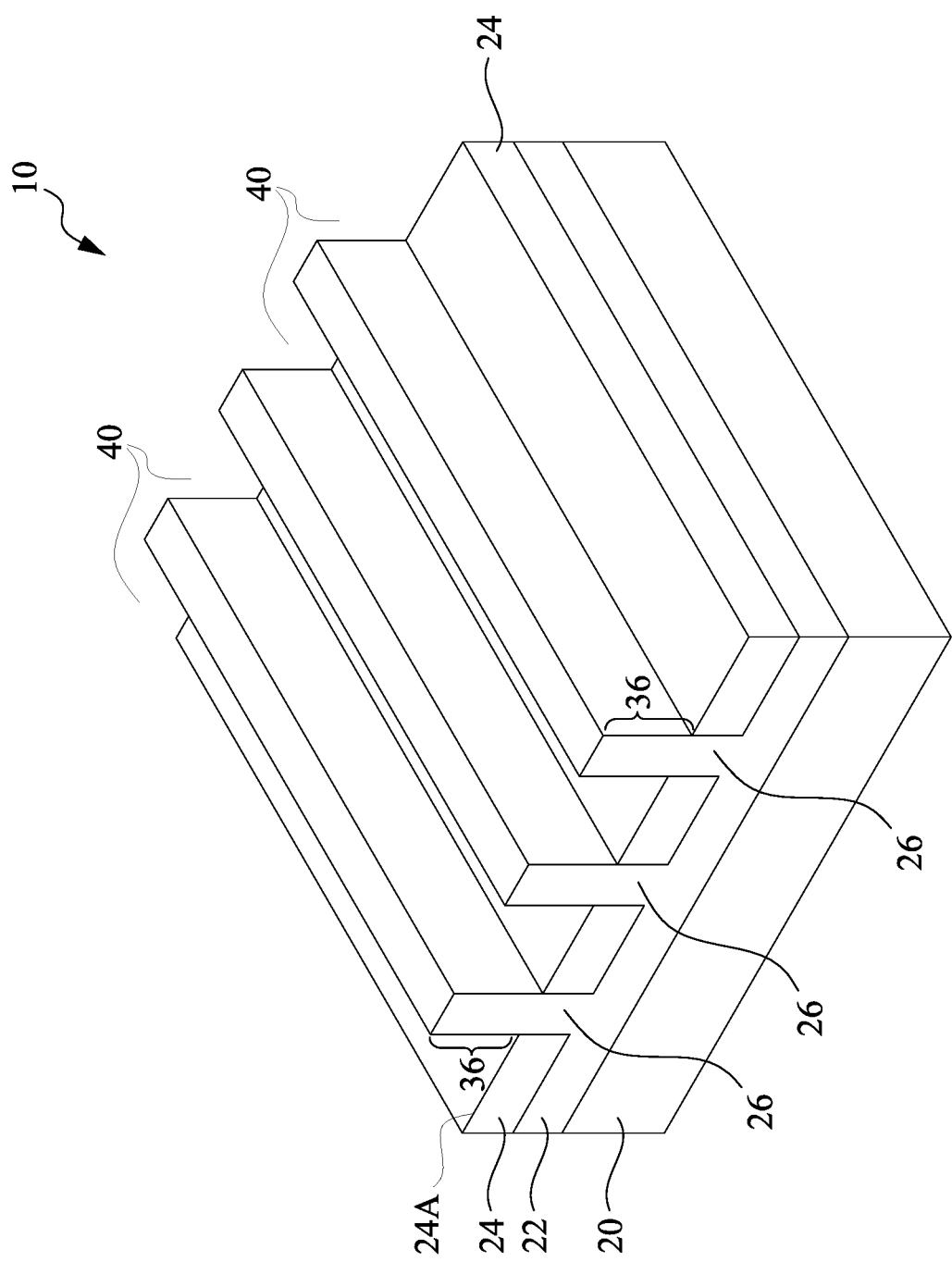

Referring to FIG. 3, STI regions 24 are recessed to form trenches 40. The top portions of semiconductor strips 26 thus protrude higher than the top surfaces 24A of the remaining portions of STI regions 24 to form protruding fins 36. The respective process is illustrated as process 206 in the process flow 200 as shown in FIG. 23. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etching process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
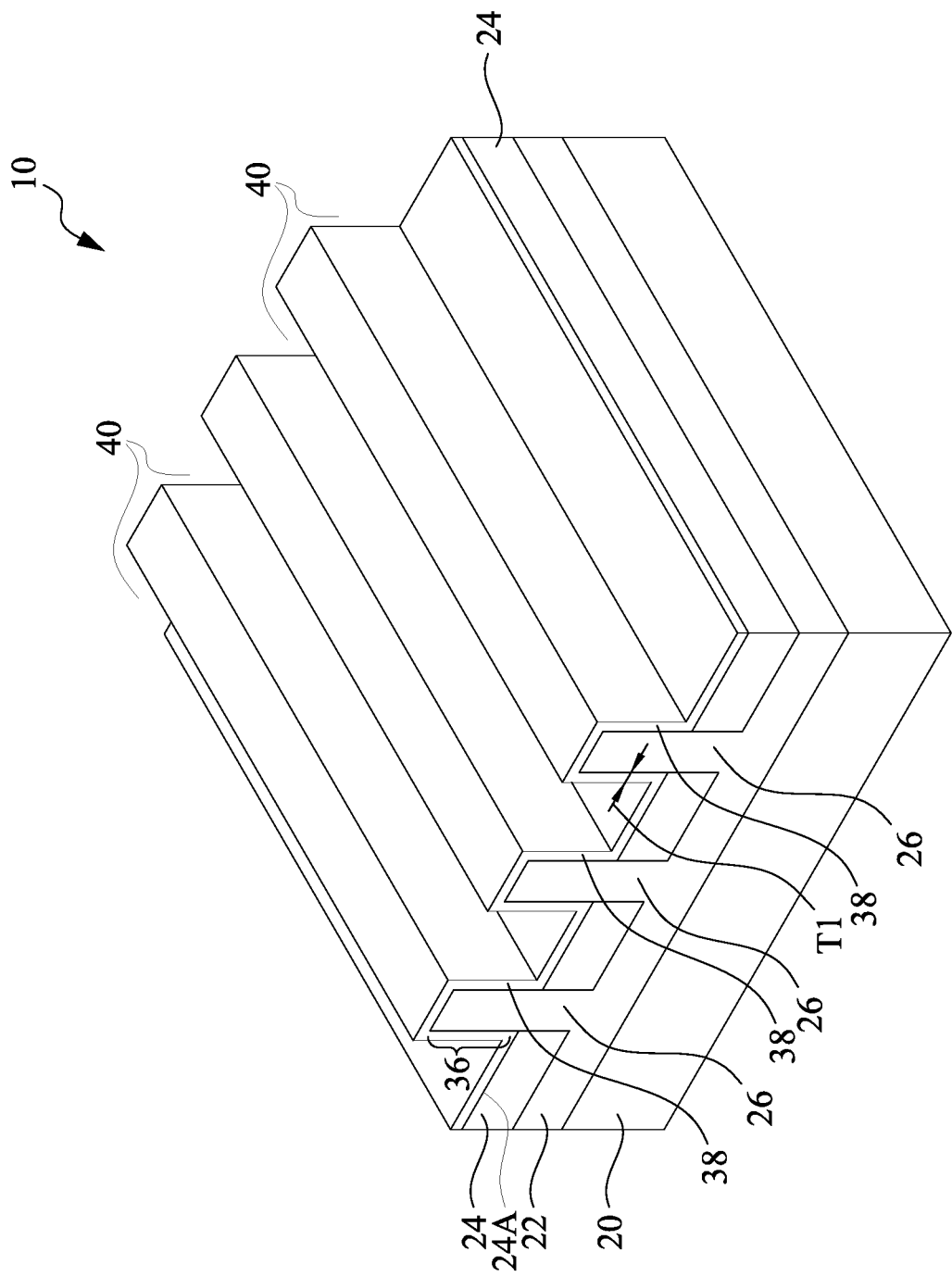

Referring to FIG. 4, dummy gate dielectric layer 38 is formed. The respective process is illustrated as process 208 in the process flow 200 as shown in FIG. 23. In accordance with some embodiments of the present disclosure, dummy gate dielectric layer 38 is formed using a conformal deposition process, which may include Atomic Layer Deposition (ALD), Chemical Vapor Deposition (CVD), or the like. The material of dielectric layer 38 may include silicon oxide, silicon nitride, silicon carbo-nitride, or the like. With the conformal deposition process being used, the horizontal thickness of the horizontal portions and the vertical thickness of the vertical portions of dielectric layer 38 are equal to each other or substantially equal to each other, for example, with a difference smaller than about 20 percent of the horizontal thickness. In accordance with some embodiments, the thickness T1 of dielectric layer 38 is in the range between about 1 nm and about 10 nm. In accordance with alternative embodiments, dielectric layer 38 is formed by oxidizing (for example, using a thermal oxidation process)

the surface portions of protruding fins 36. The resulting dielectric layer 38 will be formed on the exposed surfaces of protruding fins 36, but not on the top surfaces of STI regions 24.

Figure 5:
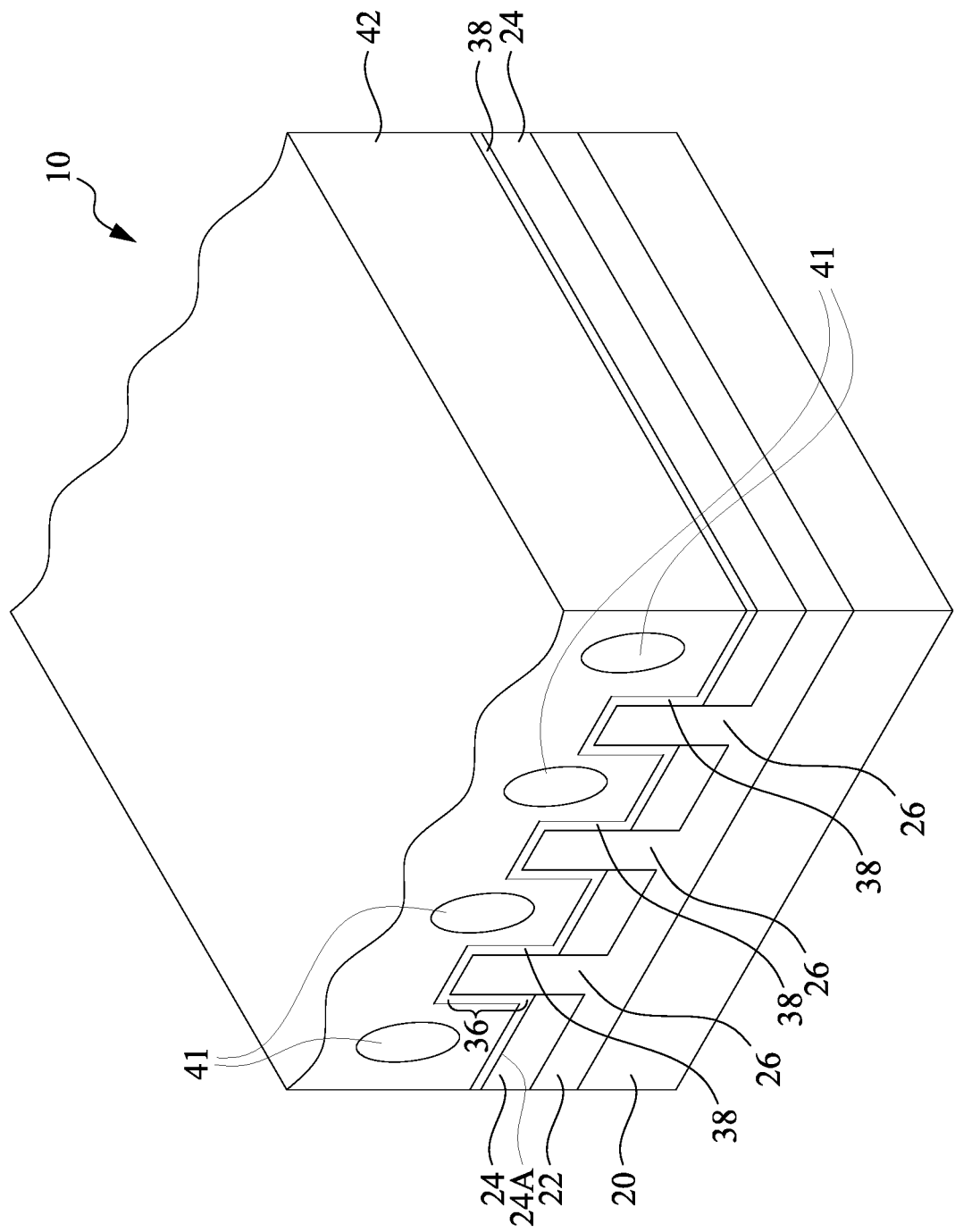
Figure 6:
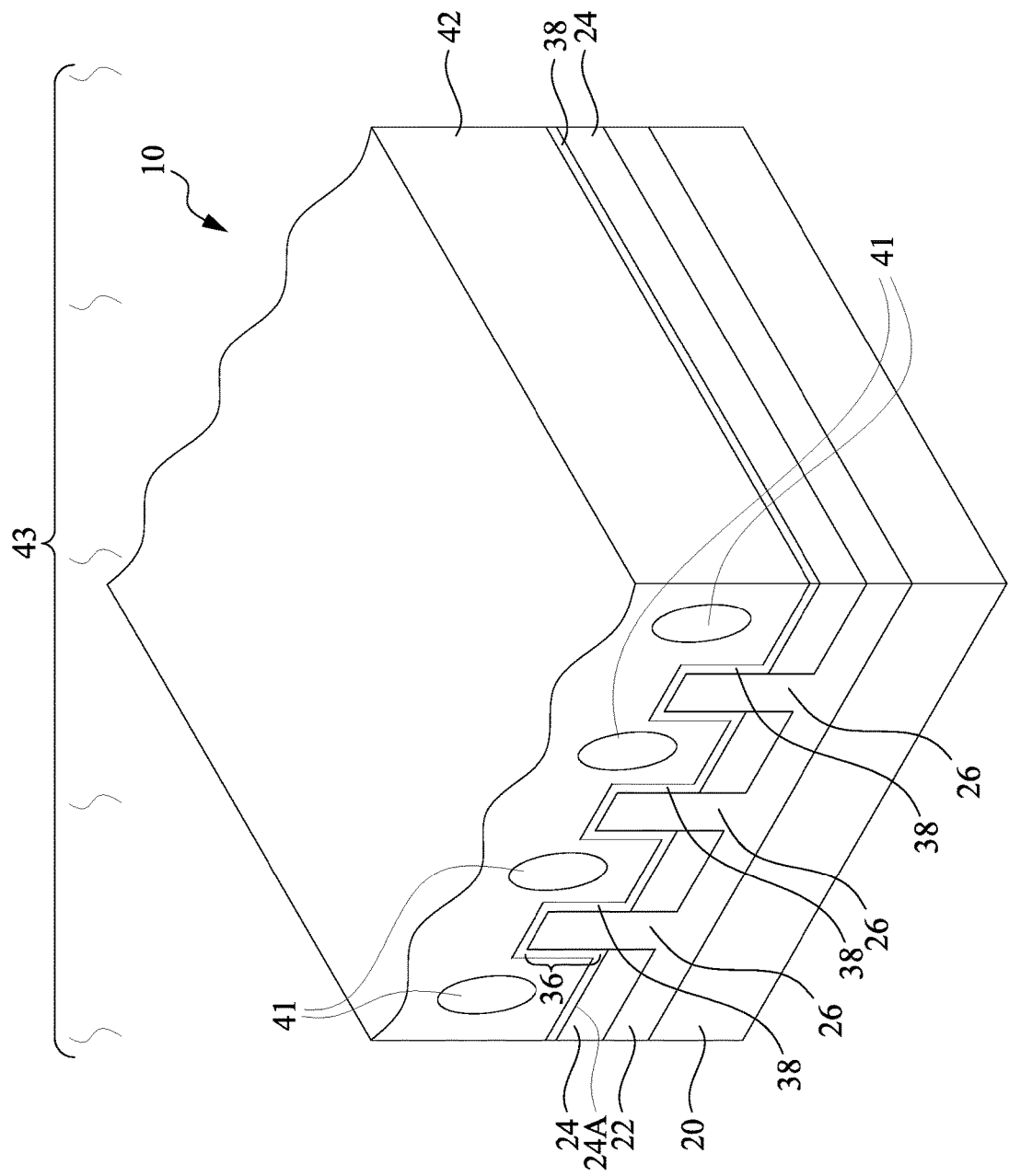
Figure 7:
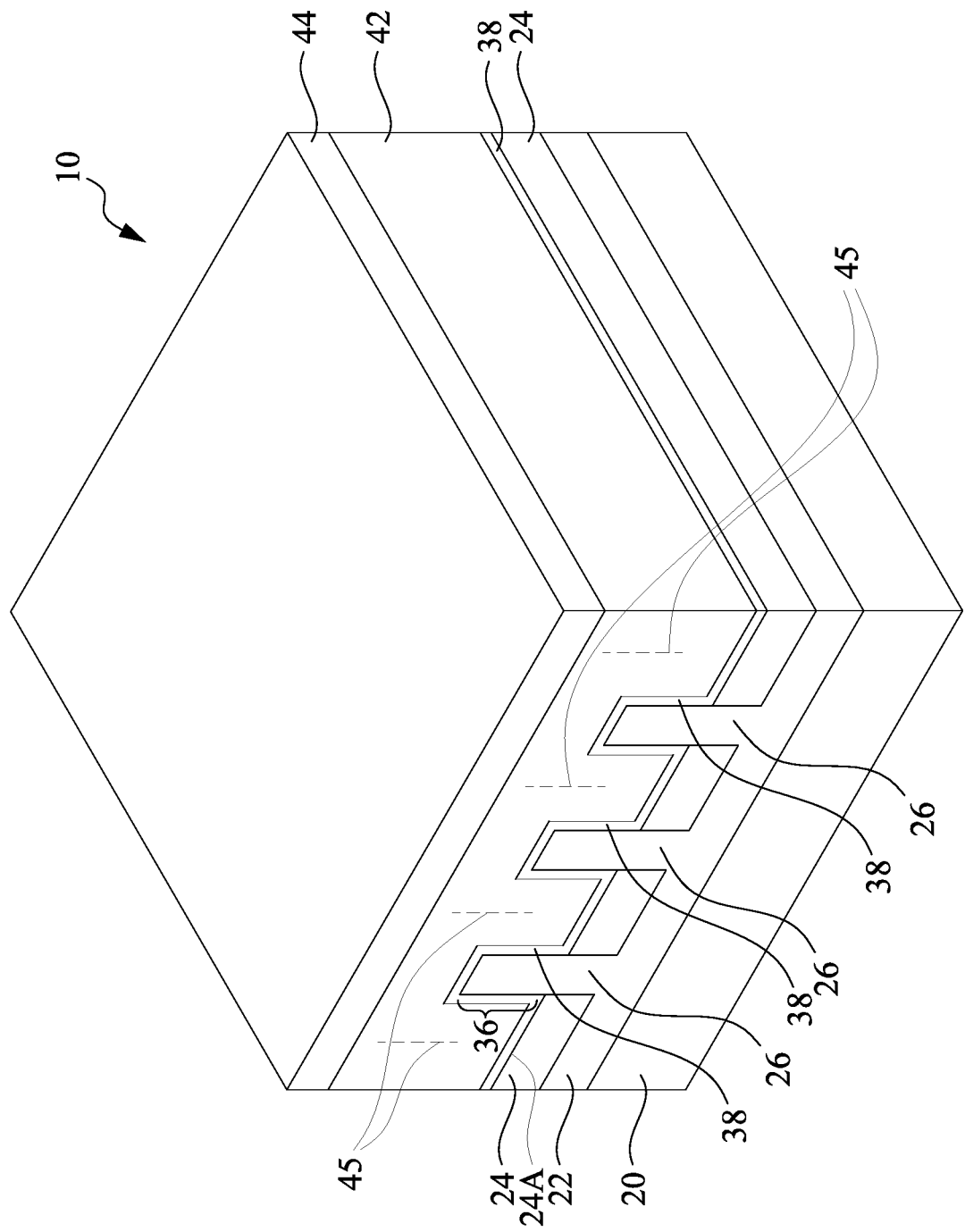

FIGS. 5 through 7 illustrate the formation of dummy gate electrode layer 42, which fills the trenches 40 as shown in FIG. 4. The corresponding formation process is thus also referred to as a trench-filling process. Referring to FIG. 5, dummy gate electrode layer 42 is deposited. The respective process is illustrated as process 210 in the process flow 200 as shown in FIG. 23. Dummy gate electrode layer 42 may be formed of or comprise amorphous silicon, polysilicon, or the mixture of polysilicon and amorphous silicon, and other materials may also be used. It is appreciated that although silicon is used as an example of the trench-filling material, the trench-filling method as discussed in the present disclosure may apply to materials other than silicon. For example, germanium or silicon germanium may be used in accordance with some embodiments.

Dummy gate electrode layer 42 may be deposited using a conformal deposition process, which may be ALD, CVD, LPCVD, or the like. The deposition may also be a non-conformal deposition process. The formation may include depositing a silicon seed layer, and then growing more silicon on the silicon seed layer. In accordance with some embodiments of the present disclosure, the silicon seed layer is deposited using a silicon-containing precursor such as $SiH_3—N((CH—CH_3)_2)_2$. After the formation of the silicon seed layer, silicon may be grown on the seed layer using a silicon-containing precursor such as disilane ($Si_2H_6$), monosilane ($SiH_4$), the mixture of disilane and monosilane, or like precursors. The temperature for growing the silicon layer using disilane may be in the range between about 300° C. and about 450° C. The temperature for growing the silicon layer using monosilane may be in the range between about 400° C. and about 600° C. Depending on the temperature, the growth rate of dummy gate electrode layer 42, and other process conditions, dummy gate electrode layer 42 may be an amorphous silicon layer, a polysilicon layer, or the mixture thereof.

In accordance with some embodiments in which germanium is to be deposited, the corresponding precursor includes a germanium-and-hydrogen containing precursor, which may be expressed as $Ge_xH_{2x+2}$ (with x being an integer equal to or greater than 1), or another germanium-containing precursor. For example, the precursor may include digermane ($Ge_2H_6$), monogermane ($GeH_4$), the mixture of digermane and monogermane, or the like. When silicon germanium is to be deposited, the silicon-containing precursors as aforementioned may be included in addition to the germanium-containing precursor.

In accordance with some embodiments, the deposition of dummy gate electrode layer 42 is a single-step deposition process, in which no additional processes such as etching back processes are inserted into the single-step deposition process. Voids 41 are generated, and may be fully sealed inside dummy gate electrode layer 42. In accordance with alternative embodiments, voids 41 are not sealed, and the top ends of voids 41 are exposed to the overlying vacuum environment (for example, the inner space of the respective vacuum chamber). Voids 41 may have the strip shapes having lengthwise directions parallel to the lengthwise direction of protruding fins 36.

Next, referring to FIG. 6, a reflow process, which is achieved through anneal process 43, is performed. The respective process is illustrated as process 212 in the process flow 200 as shown in FIG. 23. In the reflow process, a radiation source such as a laser generator, a Ultra-violet light generator, or the like is used for heating dummy gate electrode layer 42 from top side. The details of the reflow process is discussed referring to FIGS. 16 through 19, and hence are not repeated herein. The reflow causes dummy gate electrode layer 42 to be molten, and hence flows to fill voids 41. In accordance with some embodiments, voids 41 are fully filled and hence are eliminated by the reflow process. In accordance with alternative embodiments, voids 41 are reduced in volume, and are mostly eliminated, except that seams 45 remain, as shown in FIG. 7. Seams 45 are illustrated using dashed lines to indicate that they may or may not exist, depending on the process conditions, as will be discussed in subsequent paragraphs. In accordance with some embodiments, after the reflow process, a planarization process such as a mechanical grinding process or a CMP process is performed to level the top surface of dummy gate electrode layer 42.

Figure 8:
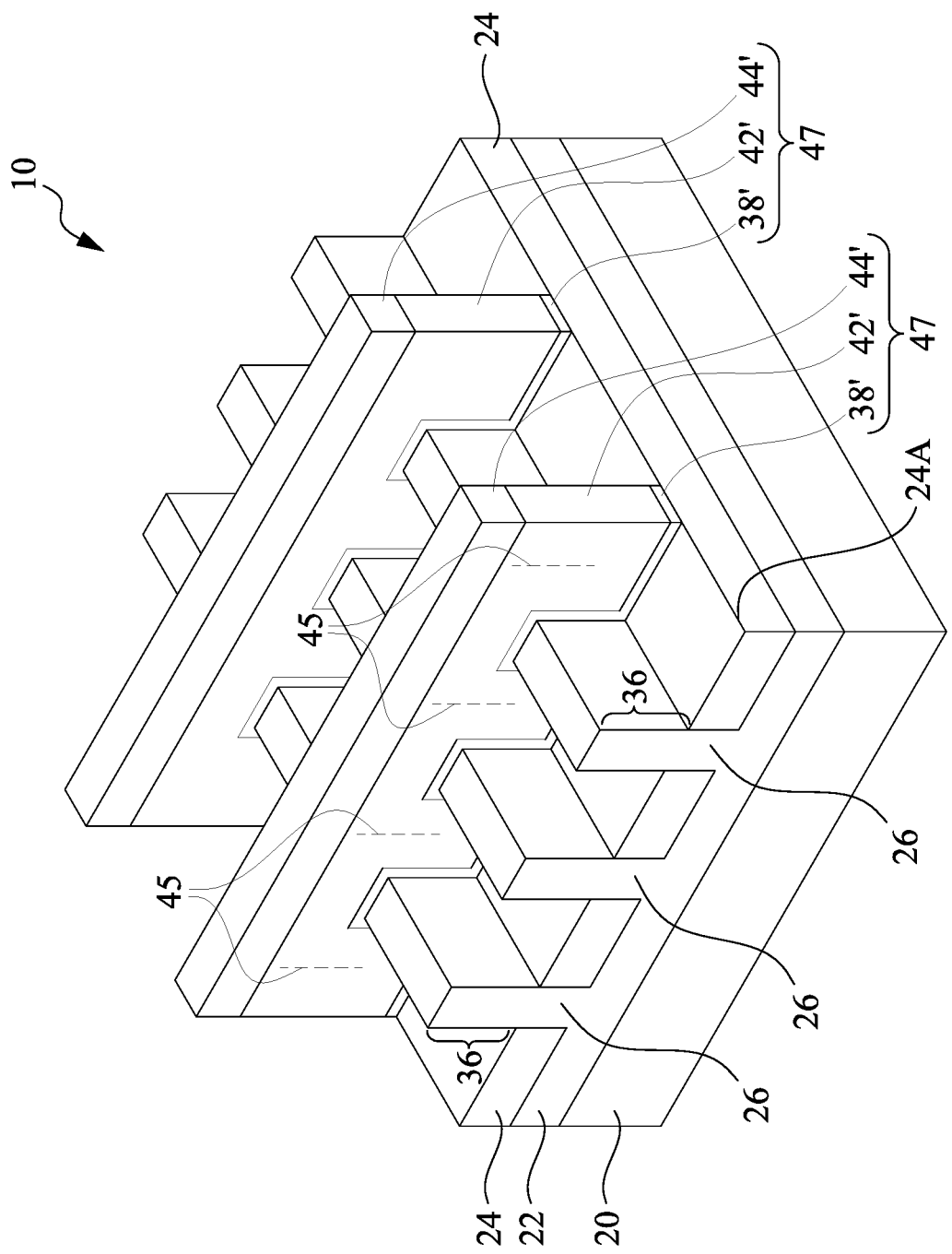

As also shown in FIG. 7, hard mask layer 44 is deposited on dummy gate electrode layer 42. Hard mask layer 44 may be formed of or comprise silicon nitride, silicon oxide, silicon oxy-carbo-nitride, or multi-layers thereof. A patterning process is then performed on hard mask layer 44, for example, using a patterned photo resist (not shown) as an etching mask. The resulting hard masks are referred to as hard masks 44', as shown in FIG. 8.

The patterned hard masks 44' are used as an etching mask to etch the underlying dummy gate electrode layer 42 (FIG. 7) and dummy gate dielectric layer 38. Dummy gate electrodes 42' and dummy gate dielectrics 38' are thus formed, as shown in FIG. 8, and are collectively referred to as dummy gate stacks 47. The respective process is illustrated as process 214 in the process flow 200 as shown in FIG. 23. The etching is performed using an anisotropic etching process. The etching of dummy gate electrode layer 42, which may be formed of amorphous silicon, polysilicon, or the like, may be performed using a process gas comprising C2F6, CF4, SO2, the mixture of HBr, Cl2, and O2, or the mixture of HBr, Cl2, O2, and CF2 etc.

Figure 9:
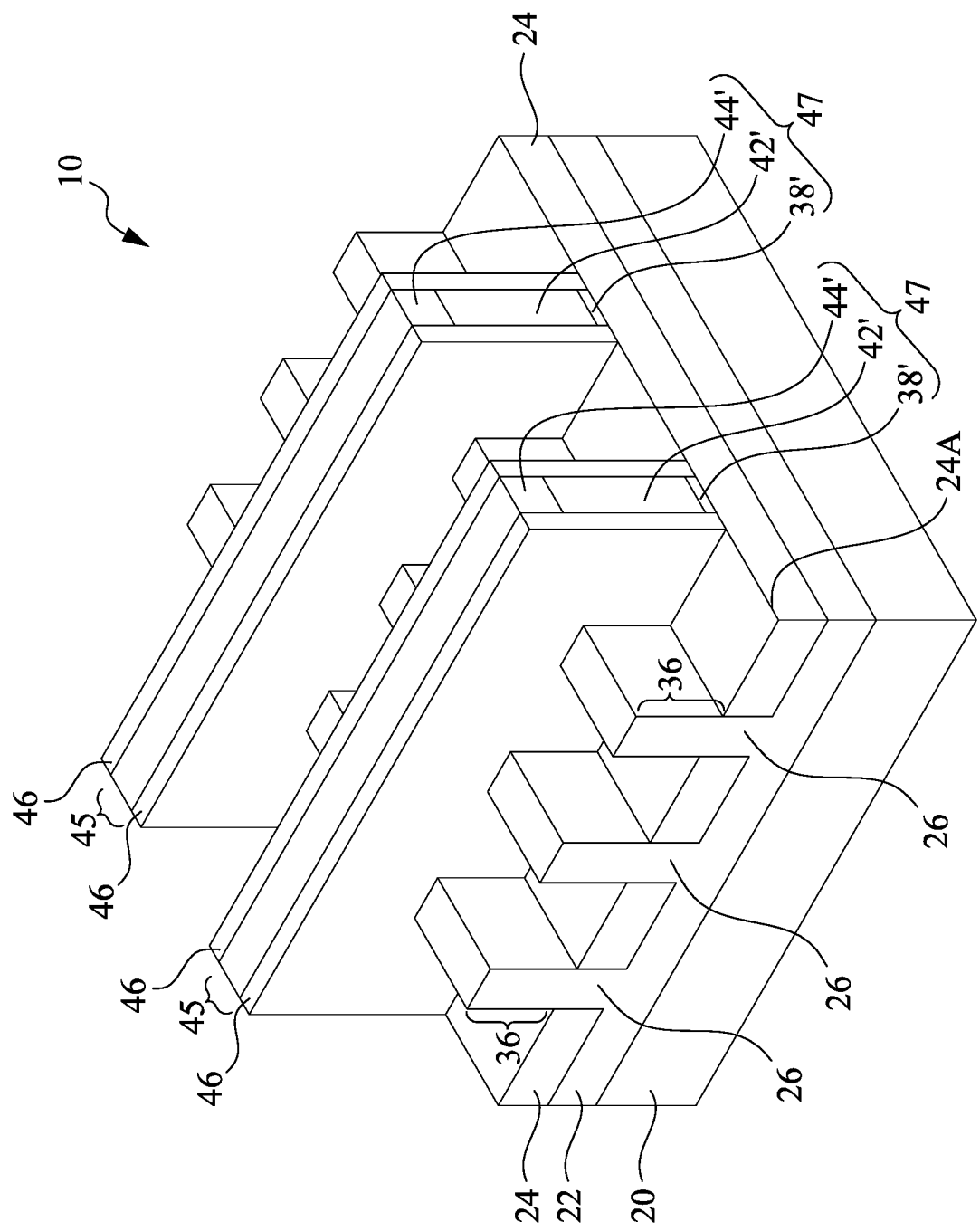

Next, as shown in FIG. 9, gate spacers 46 are formed on the sidewalls of dummy gate stacks 47. The respective process is illustrated as process 216 in the process flow 200 as shown in FIG. 23. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 10:
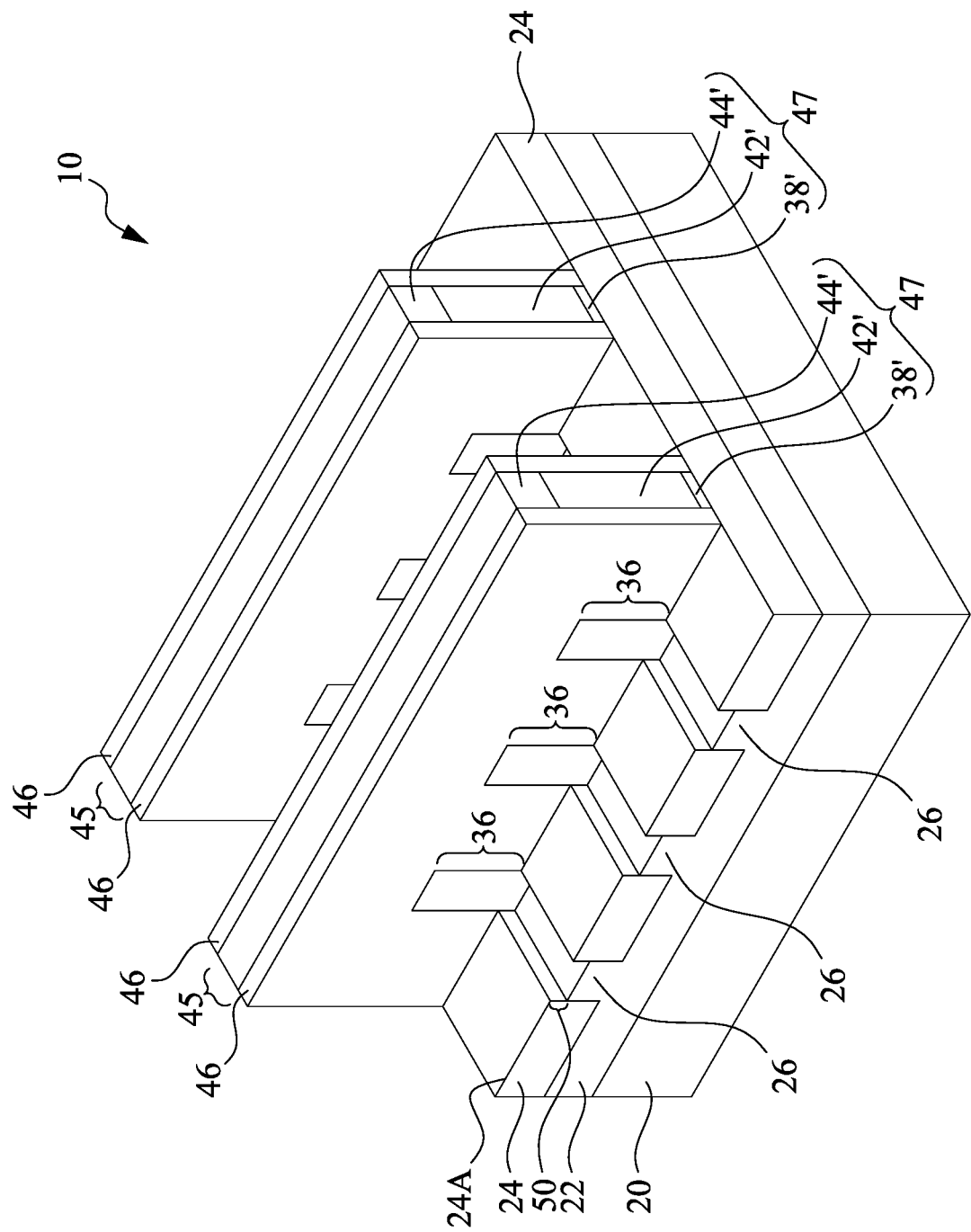

Next, the portions of protruding fins 36 that are not covered by dummy gate stacks 47 and gate spacers 46 are etched, resulting in the structure shown in FIG. 10. The respective process is illustrated as process 218 in the process flow 200 as shown in FIG. 23. The recessing may be anisotropic, and hence the portions of fins 36 directly underlying dummy gate stacks 47 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise some portions located on the opposite sides of dummy gate stacks 47, and some portions between the remaining portions of protruding fins 36.

Figure 11:
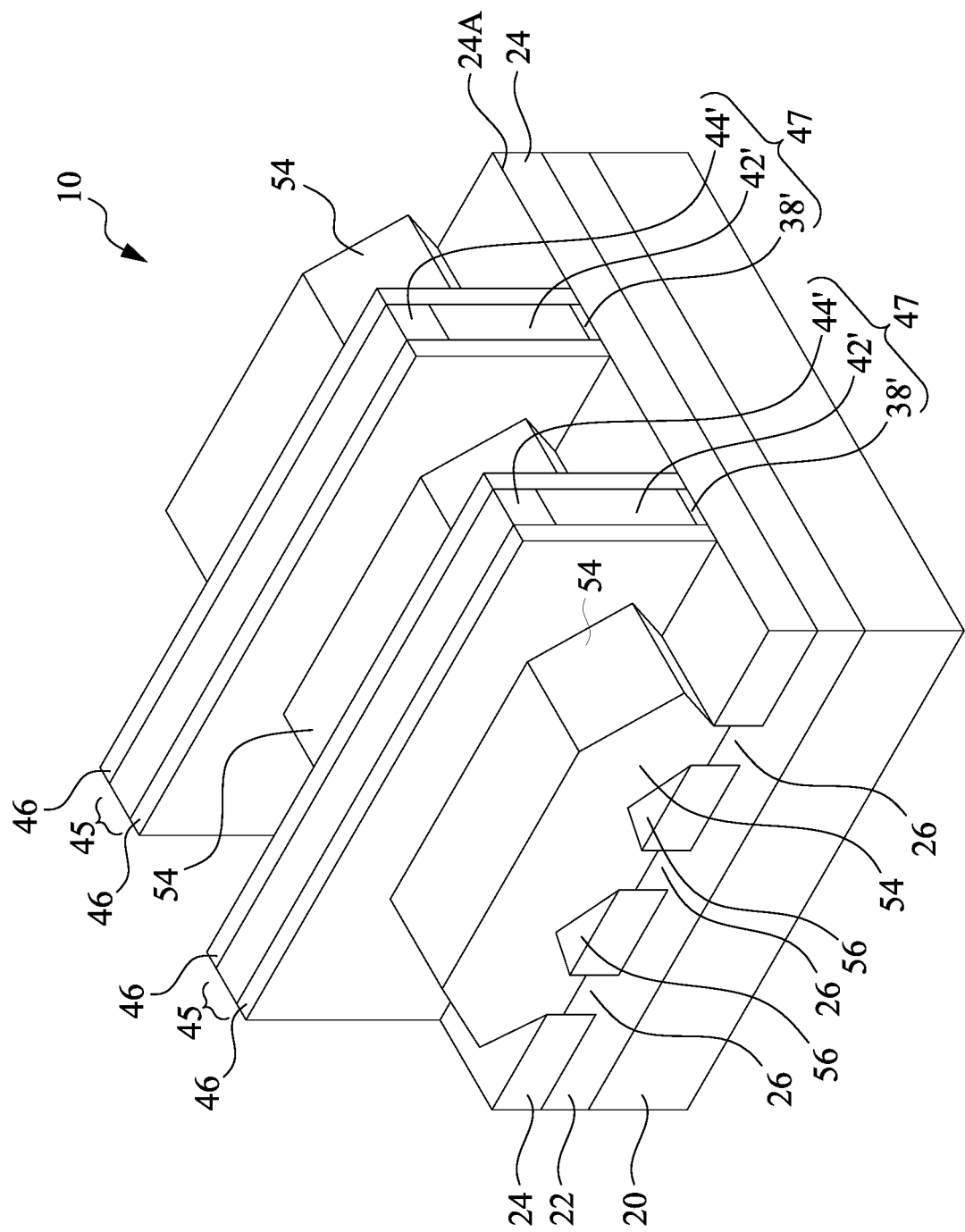

Next, epitaxy regions (source/drain regions) 54 are formed by selectively growing (through epitaxy) a semiconductor material in recesses 50, resulting in the structure in FIG. 11. The respective process is illustrated as process 220 in the process flow 200 as shown in FIG. 23. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 12:
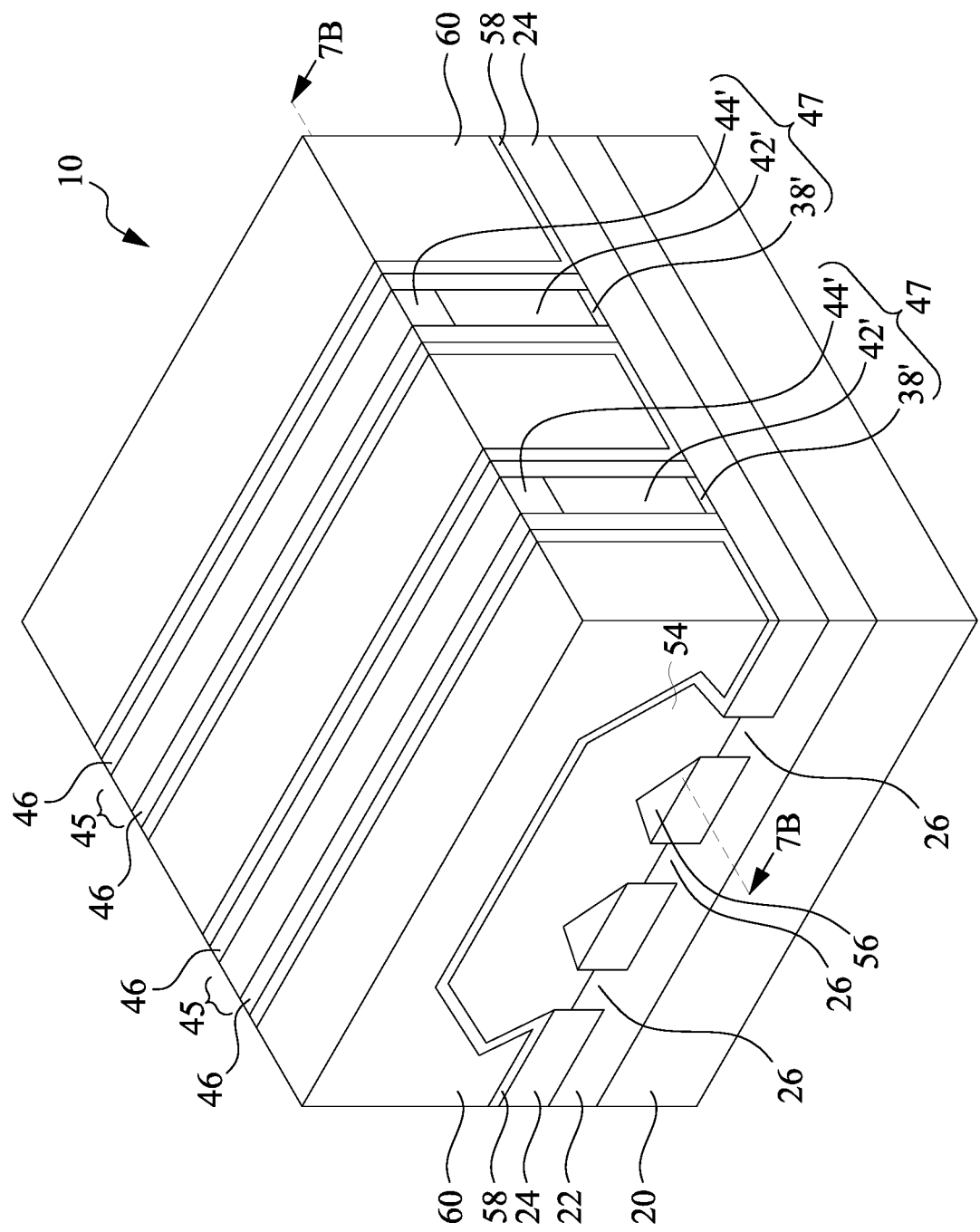

FIG. 12 illustrates a perspective view of the structure after the formation of Contact Etch Stop Layer (CESL) 58 and Inter-Layer Dielectric (ILD) 60. The respective process is illustrated as process 222 in the process flow 200 as shown in FIG. 23. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 47, and gate spacers 46 with each other. FIG. 11B illustrates the reference cross-section 11B-11B as shown in FIG. 11A.

Figure 13:
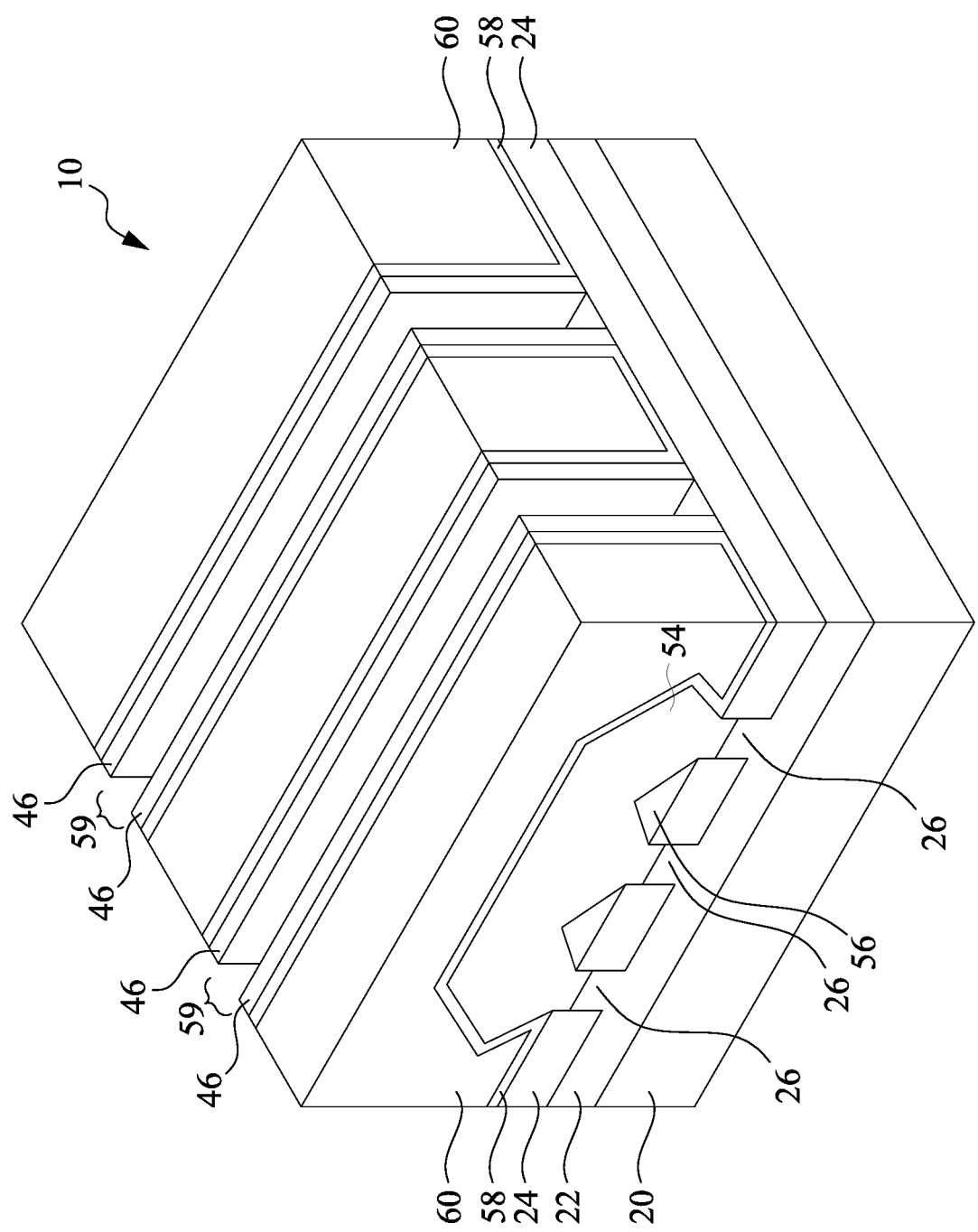

Hard masks 44', dummy gate electrodes 42', and dummy gate dielectrics 38' are then removed, forming trenches 59 between gate spacers 46, as shown in FIG. 13. The respective process is illustrated as process 224 in the process flow 200 as shown in FIG. 23.

Figure 14:
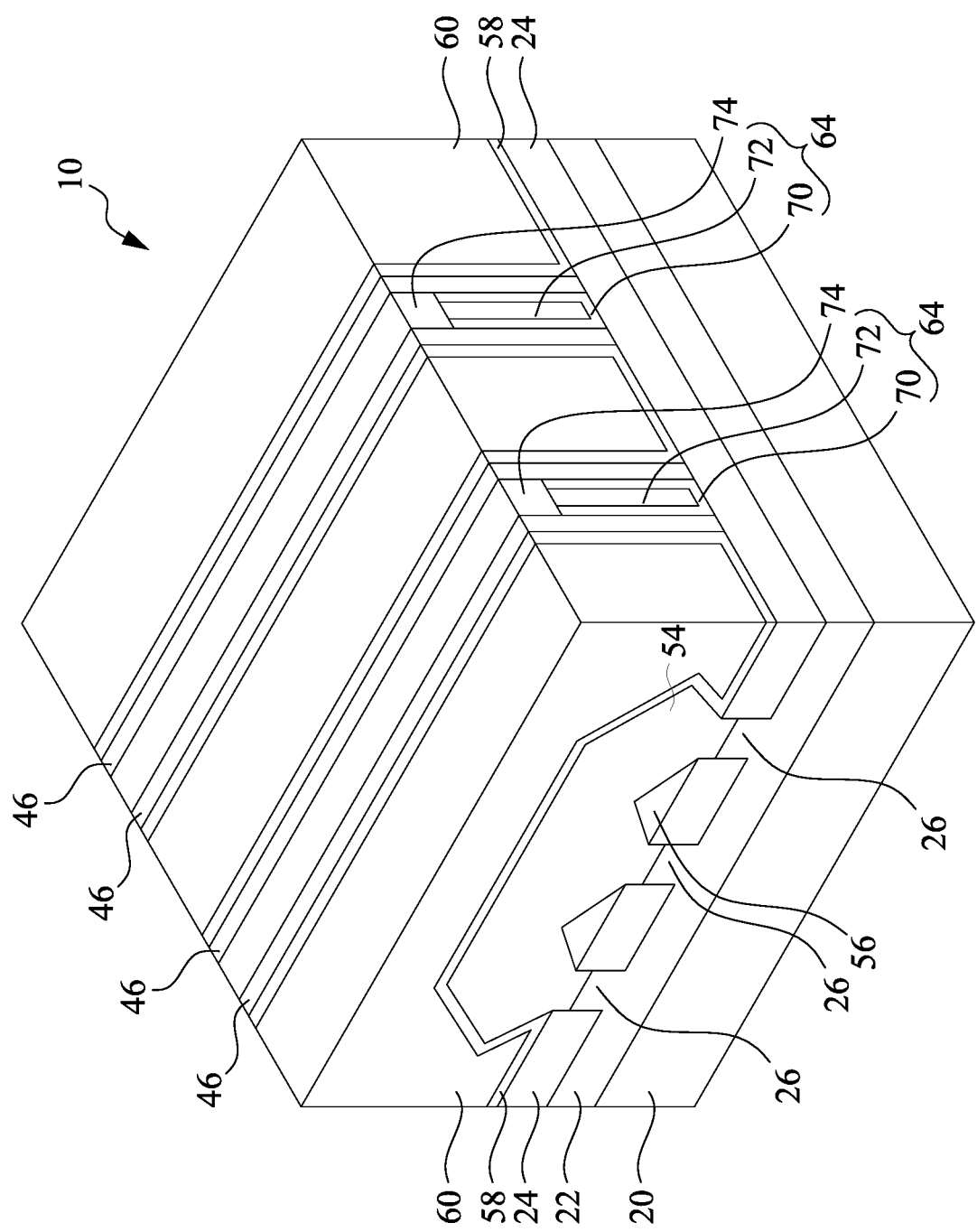

FIG. 14 illustrates the formation of replacement gate stacks 64. The respective process is illustrated as process 226 in the process flow 200 as shown in FIG. 23. Gate stack 64 includes gate dielectric 70 and gate electrode 72. Gate dielectric 70 may include an Interfacial Layer (IL, not shown separately) and a high-k dielectric layer (not shown). The IL is formed on the exposed surfaces of protruding fins 36, and may include an oxide layer such as a silicon oxide layer, which is formed through the thermal oxidation of protruding fins 36, a chemical oxidation process, or a deposition process. The high-k dielectric layer includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer is formed using ALD, CVD, or the like.

In accordance with some embodiments, gate electrode 72 includes stacked layers, which may include a diffusion barrier layer (a capping layer), and one or more work-function layer over the diffusion barrier layer. The diffusion barrier layer may be formed of titanium nitride, which may (or may not) be doped with silicon. The work-function layer determines the work-function of the gate electrode, and includes at least one layer, or a plurality of layers formed of different materials. The specific material of the work-function layer may be selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl-containing layer over the TiN layer. After the deposition of the capping layer and the work-function layer, a glue layer, which may be another TiN layer, may be formed. The glue layer may be formed using CVD. A metal-filling region is then formed on the stacked layers and fully fills trenches 59 (FIG. 13). The formation of the metal-filling region may be achieved through CVD, ALD, Physical Vapor Deposition (PVD), or the like, and metal-filling region may be formed of or comprise cobalt, tungsten, alloys thereof, or other metal or metal alloys.

Next, a planarization such as a CMP process or a mechanical grinding process is performed, so that the top surface of gate stack 64 is coplanar with the top surface of ILD 60. In a subsequent process, gate stack 64 is etched back, resulting in a recess formed between opposite gate spacers 46. Next, hard masks 74 are formed over replacement gate stacks 64. The respective process is illustrated as process 228 in the process flow 200 as shown in FIG. 23. In accordance with some embodiments of the present disclosure, the formation of hard masks 74 includes a deposition process to form a blanket dielectric material, and a planarization process to remove the excess dielectric material over gate spacers 46 and ILD 60. Hard masks 74 may be formed of silicon nitride, for example, or other like dielectric materials.

Figure 15:
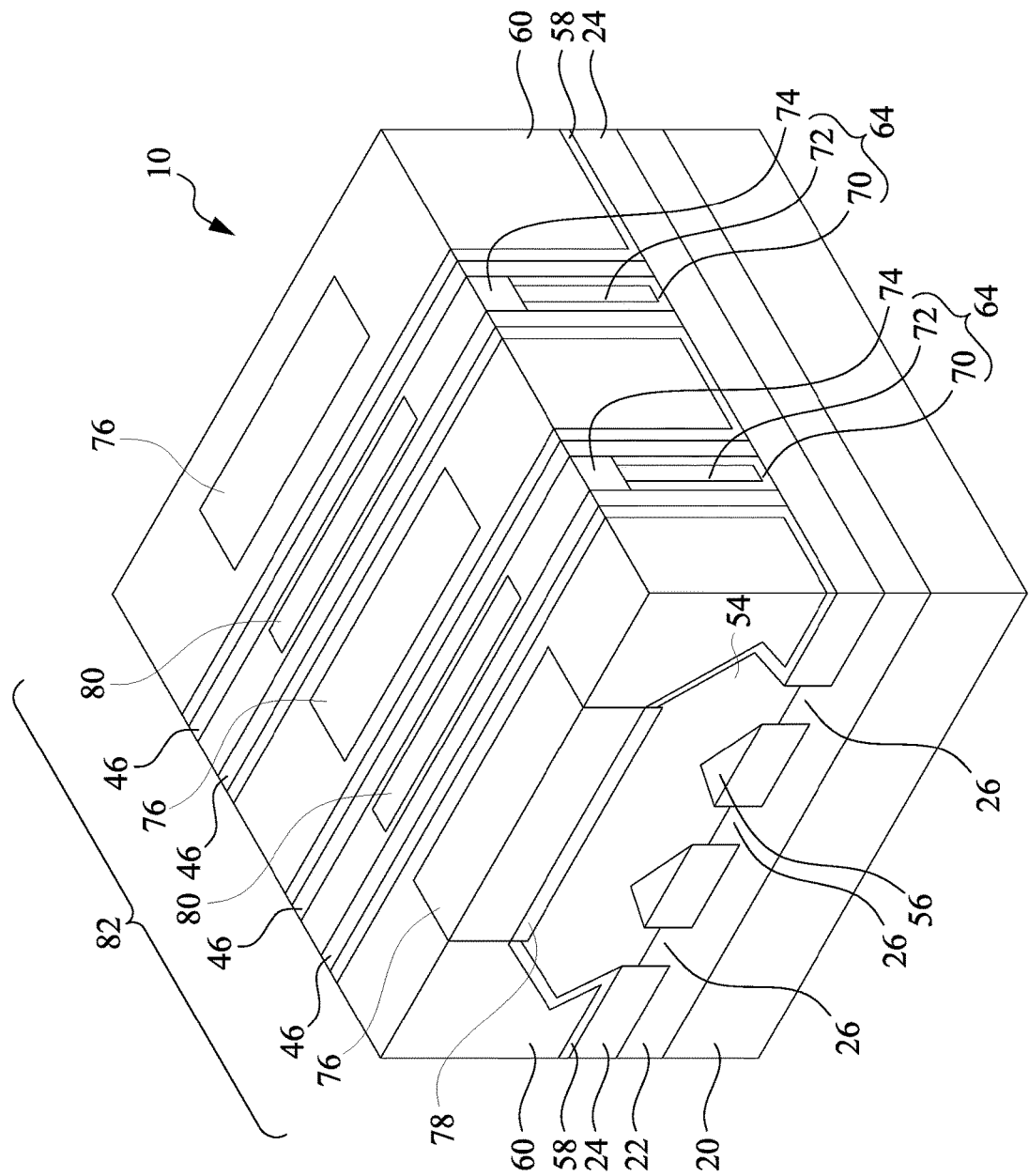

FIG. 15 illustrates some of the features formed in subsequent processes, which may include source/drain contact plugs 76, source/drain silicide regions 78, and gate contact plugs 80. The respective process is illustrated as process 230 in the process flow 200 as shown in FIG. 23. The details of the processes are not discussed herein. FinFET 82 is thus formed.

FIGS. 16 through 19 illustrate the cross-sectional views of intermediate stages in a trench-filling process, with a trench-filling material (such as silicon) filled into trenches in accordance with some embodiments. The respective process flow is shown as flow 300 in FIG. 24. It is appreciated that the formation of dummy gate electrode layer 42 (FIG. 7) is an application of the process shown in FIGS. 16 through 19.

Figure 16:
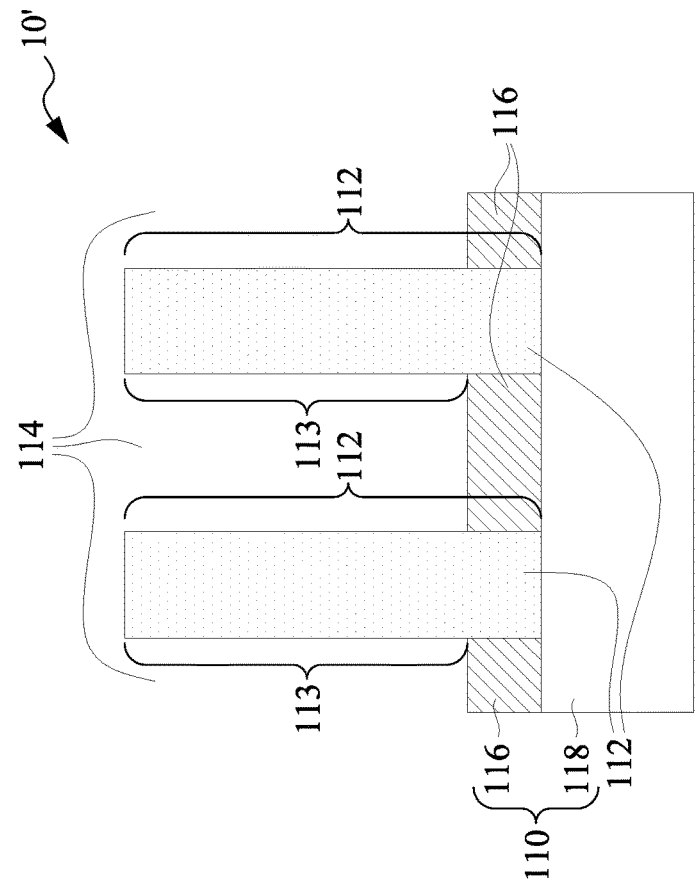
Figure 24:
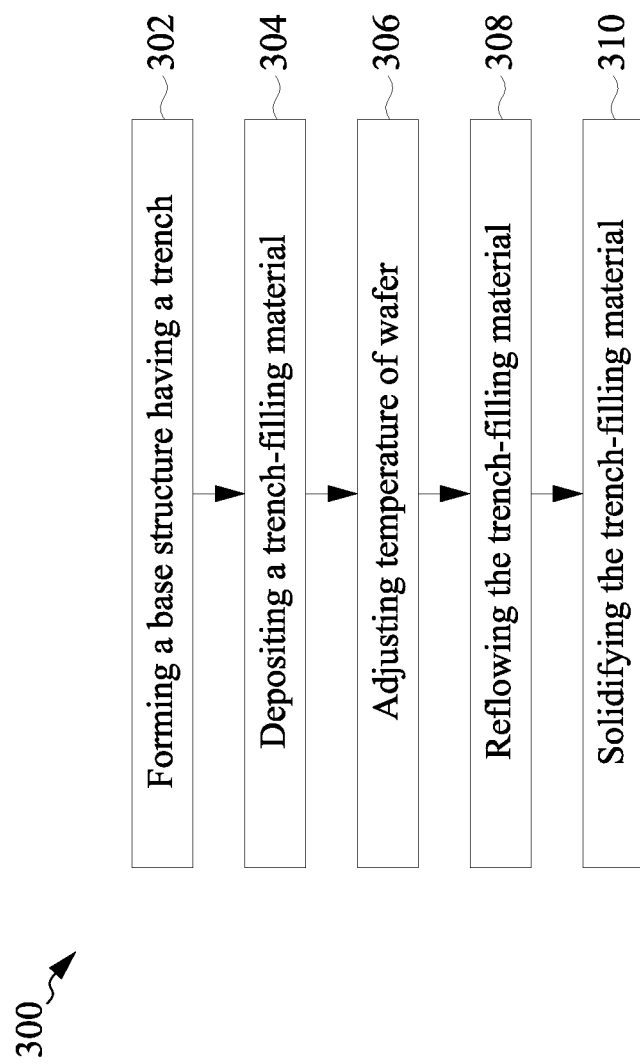
FIG. 24 illustrates a process flow of a trench-filling process in accordance with some embodiments.

FIG. 16 illustrates the formation of a base structure 110 including trenches 114 in accordance with some embodiments. The respective process is illustrated as process 302 in the process flow 300 as shown in FIG. 24. Strips 112 are formed extending into base structure 110. Strips 112, when viewed from top, may be elongated strips, and the plane shown in FIG. 16 is perpendicular to the lengthwise directions of strips 112. Some portions of strips 112 protrude higher than the top surface of base structure 110 to form protruding fins 113. Trenches 114 are between protruding fins 113. In accordance with some embodiments of the present disclosure, the aspect ratio (the ratio of depth to width) of trenches 114 is greater than 2, and may be greater than 3, and may further be between about 3 and about 10.

Base structure 110 includes surface regions 116 and underlying portion 118. It is appreciated that each of surface regions 116 and protruding fins 113 may be formed of a homogeneous material, or may have a multi-layer (and/or multi-region) structure including multiple layers and/or regions formed of different materials. For example, protruding fins 113 may include one or more material including $SiO_2$, SiN, $HfO_2$, TiN, W, crystal Si, TaN and or any combination thereof. Surface regions 116 may include one or more material including $SiO_2$, $HfO_2$, TiN, TaN, W, and or any combination thereof. Protruding fins 113 and surface regions 116 may be formed using methods selected from sputtering, CVD, or ALD, Flowable CVD (FCVD), ECP evaporation, PVD, and the like.

In accordance with some embodiments of the present disclosure, the trench-filling process as shown in FIGS. 16 through 19 is used to form dummy gate electrode layer 42 as shown in FIG. 7. Accordingly, wafer 10' in FIGS. 16 through 19 corresponds to wafer 10 in FIG. 7. Protruding fins 113 in FIG. 16 may correspond to protruding fins 36 in FIG. 7 in combination with the portions of dummy gate dielectric layer 38 on protruding fins 36. Base structure 110 corresponds to the collection of the STI regions 24, bulk substrate 20 and semiconductor strips 26, and possibly the horizontal portions of dummy gate dielectric layer 38 as shown in FIG. 7. Surface regions 116 may correspond to STI regions 24. The formed trench-filling material 120 (FIG. 19) corresponds to dummy gate electrode layer 42 in FIG. 7.

It is appreciated that FIG. 7 is an example of the structure on which trench-filling process is performed, while the trench-filling process according the embodiments of the present disclosure may be performed on other structures. For example, the trench-filling process may be performed in a Front-End-of-Line (FEOL) process (the processes including the formation of transistors and the processes before the formation of transistors) or in a Back-End-of-Line (BEOL) process (the processes performed after the formation of transistors including the formation of interconnect structures).

Figure 17:
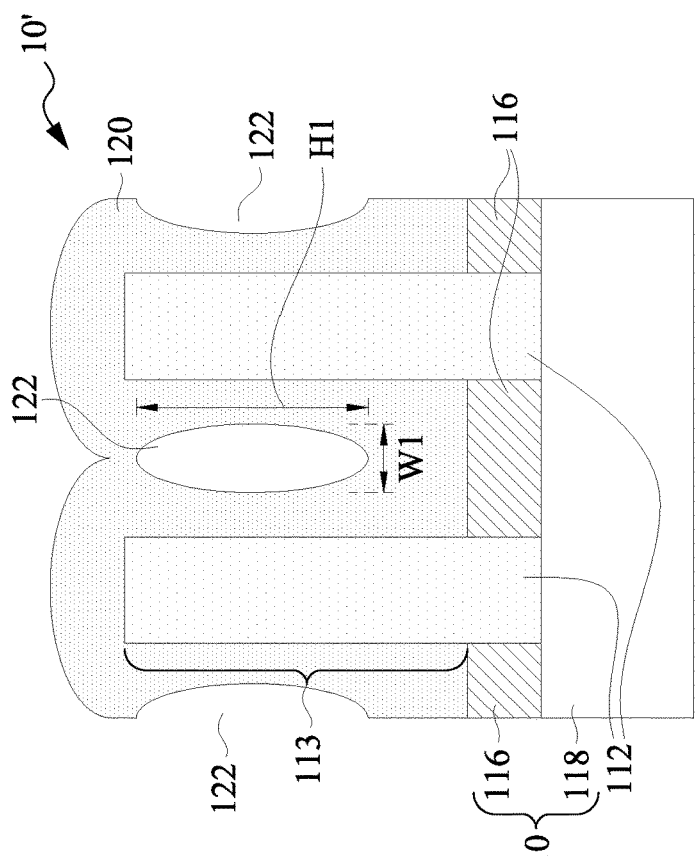

Referring to FIG. 17, a deposition process is performed to deposit trench-filling material 120. The respective process is illustrated as process 304 in the process flow 300 as shown in FIG. 24. The trench-fill material 120 may be a semiconductor material, a conductive material such as a metallic material, a dielectric material, or the like. For example, the trench-fill material 120 may include pure or substantially pure amorphous silicon (for example, with a silicon atomic percentage greater than about 95 percent), a pure or substantially pure amorphous germanium (for example, with a germanium atomic percentage greater than about 95 percent), silicon germanium, copper, the like material, or any combination thereof. The deposition process may be performed using CVD, PVD, PECVD, ALD, LPCVD, or other applicable materials, depending on the material of trench-filling material 120. When formed of or comprising silicon, germanium, or silicon germanium, the formation process and the corresponding precursors may be as discussed referring to FIG. 5. The deposition is performed until the top surfaces of trench-filling material 120 are higher than the top surfaces of protruding fins 113. In accordance with some embodiments, trench-filling material 120 is deposited in a continuous process, with no other process such as an etching process, an annealing process, etc., inserted into the deposition process of trench-filling material 120. The deposition process may be performed in a vacuum environment or open air.

Due to the high aspect ratio of trenches 114, voids 122 may be generated in trench-fill material 120. The top ends of voids 122 may be closed, so that voids 122 may be fully sealed in trench-filling material 120. In these embodiments, voids 122 are vacuum voids or air gaps. In accordance with alternative embodiments, there may be some or all of voids 122 that have top ends exposed to the outside environment. In accordance with some embodiments, widths W1 of voids 122 are greater than about 1 nm, and heights H1 of voids 122 are greater than about 3 nm.

In accordance with some embodiments, protruding fins 113 (and strips 112) have a first melting point MP113, and surface regions 116 have a second melting point MP116. When protruding fins 113 include a plurality of layers (or regions) formed of different materials, the melting point MP113 is the melting point of the layer/region that has the lowest melting point in protruding fins 113. Similarly, when surface regions 116 include more than one layer/region formed of different materials, the melting point MP116 is the melting point of the layer/region that has the lowest melting point in surface regions 116. For example, among the candidate materials for forming protruding fins 113, $SiO_2$ has the melting point of 1,710° C., crystal silicon has the melting point of 1,412° C., and SiN has the melting point of 1,900° C. Among the candidate materials for forming surface regions 116, $HfO_2$ has the melting point of 2,758° C., tungsten has the melting point of 3,422° C., TiN has the melting point of 2,930° C., and TaN has the melting point of 3,090° C.

Trench-filling material 120 has a third melting point MP120 lower than both of melting points MP113 and MP116. For example, among the candidate materials for forming trench-filling material 120, crystal germanium has the melting point of 937° C., amorphous silicon has the melting point in the range between about 1,000° C. and about 1,100° C., amorphous germanium has the melting point of about 700° C., amorphous SiGe has the melting point between 700° C. and about 1,100° C., and copper has the melting point of 1,083° C. Furthermore, both of differences (MP113–MP120) and (MP116–MP120) may be high enough so that in the subsequent reflow of trench-filling material 120, an adequate process margin is provided to ensure that surface regions 116 and protruding fins 113 are not molten. For example, both of differences (MP113–MP120) and (MP116–MP120) may be greater than about 100° C., and may be in the range between about 100° C. and about 300° C.

Referring to FIG. 18, a local heating process 124 is performed, so that trench-filling material 120 is reflowed, for example. The respective process is illustrated as process 308 in the process flow 300 as shown in FIG. 24. The local heating process 124 may be performed using energy source 126, which may be a radiation source such as a laser generator, an ion beam generator, an electron beam generator, a UV light generator, or the like. Throughout the description, the term "local heating" refers to the process in which the top portions of the respective wafer 10' (which top portion includes trench-filling material 120) is heated to a temperature equal to or higher than the melting point MP120, while the bottom portion 118 of wafer 10' (if heated) is at temperatures lower than melting point MP120. The bottom portion of wafer 10' may not be heated directly, or may be heated as discussed in subsequent paragraphs.

Throughout the description, the local heating process 124 is also referred to as a reflow process 124.

In accordance with some embodiments, the local heating process is performed using pulse laser, which may be XeCl laser, ArF laser, KrF laser, ruby laser, or the like. The laser energy may be in the range between about 0.1 mJ/cm² and about 10 mJ/cm². The pulse duration is shorter than about 1 micro second, and may be in the range between about 10 ns and about 990 ns, the pulse applied on a portion of trench-filling material 120 may be a single pulse or a combination of multiple pulses. In accordance with some embodiments, the pulse laser is applied on one region of the corresponding wafer, and the spot size of the laser may cover one die, a fraction of one die, or a plurality of dies. For example, the pulse laser may be applied on one area of wafer 10 to cause the melting of the trench-filling material 120 in this area, and then move to a next area to repeat the pulse laser melting process. The pulse laser melting process is performed area-by-area until all areas of wafer 10' are covered. In accordance with alternative embodiments, the reflow process is performed using an ion beam, an electron beam, a laser beam, or the like, which may be used to scan wafer 10'. In the reflow process, the trench-filling material 120 is heated to a temperature in the range between about 300° C. and about 1,300° C., and the temperature is equal to or higher than melting point MP120, and lower than both of melting points MP113 and MP116.

In accordance with some embodiments in which the embodiments in FIG. 17 is applied on the example embodiments in FIG. 5, trench-filling material 120 is the gate electrode layer 42, and reflow process 124 in FIG. 18 is the reflow process 43 shown in FIG. 6.

In the reflow process, at least an upper portion, and possibly an entirety, of trench-filling material 120 is molten. In the entire reflow process, protruding fins 113 (and the lower parts of strips 112), surface regions 116, and lower portion 118 remain to be solid and un-molten. In order to eliminate or at least significantly reduce voids 122, the molten parts at least extend to the bottoms of voids 122, and may extend to the bottoms of trench-filling material 120. Simulation results indicate that the depth of the molten parts is related to several factors including the energy density, the length of the pulse, etc. The absorption depth of the laser is around 10 nm, and the portion of the trench-filling material 120 above this depth receives the laser energy directly, and deeper portions of the trench-filling material 120 receive the energy through conduction from the respective upper parts. With the increase in the energy density, the surface parts within the absorption depth receive more energy, and lower parts can also receive more energy (through conduction), and hence higher temperatures may be achieved in the lower parts. For example, with an energy density of about 0.4 J/cm², the portions of trench-filling material 120 reaching a temperature of 1,170° C. or higher may have a depth between about 115 nm and about 135 nm. As a comparison, with an energy density of about 0.44 J/cm², the portions of trench-filling material 120 reaching a temperature of 1,290° C. (which causes the full melting of crystal silicon) or higher may have a depth between about 135 nm and about 155 nm. With an energy density of about 0.9 J/cm², the portions of trench-filling material 120 reaching a temperature of 2,600° C. or higher may have a depth between about 135 nm and about 155 nm. This indicates that with the increase in the energy density, higher temperature and greater melting depth may be achieved.

The pulse laser has an energy distribution in a laser pulse (rather than a fixed power density value throughout the entire pulse), wherein after the laser pulse is started, the laser energy density increases gradually to a peak, and then reduces to zero. With a given energy density, with the increase in the duration of the pulse, the energy distribution causes the molten parts of trench-filling material 120 to extend down until reaching a deepest point, and then the trench-filling material 120 cools down and solidify from bottom toward top. Accordingly, the reflow process is adjusted so that when the melting parts reach to a lowest level, the bottom of the molten parts is at least level with, and may be lower than the bottoms of voids 122.

In accordance with some embodiments, in the reflow process, an entirety of trench-filling material 120 is fully molten. In accordance with alternative embodiments, in the reflow process, the upper parts of trench-filling material 120, which upper parts are higher than the bottoms of voids 122, are fully molten, while the lower parts lower than the bottoms of voids 122 are either partially molten or remain solid. When the lower parts are partially molten, it means the partially molten parts include liquid mixed with solid.

Further referring to FIG. 18, a temperature adjusting unit 125 is provided, which may be placed underlying and contacting wafer 10'. Temperature adjusting unit 125 is used for adjusting the temperature of wafer 10', either by heating wafer 10' or cooling wafer 10'. The respective process is illustrated as process 306 in the process flow 300 as shown in FIG. 24. Temperature adjusting unit 125 may include heat-exchanging unit 127 configured to heat or cool wafer 10'. In accordance with alternative embodiments, no temperature adjusting unit 125 is provided, and wafer 10' does not receive additional cooling or heating other than the heating received from the energy source 126. Accordingly, process 306 is shown in a dashed box to indicate this process may or may not be performed.

In accordance with some embodiments, temperature adjusting unit 125 is a heating unit, and heat-exchanging unit 127 is a heater, which may be or include a heating coil. The temperature adjusting unit 125 may heat wafer 10', and the temperature of trench-filling material 120 is pre-heated to a temperature lower than the melting point MP120. Since the heating is a global heating process for heating the entire wafer 10', the temperatures of protruding fins 113 and surface regions 116 are also heated. Trench-filling material 120 is heated by temperature adjusting unit 125 to temperature Temp124. In accordance with some embodiments, the temperature difference (MP120−Temp124) is low enough to make the reflow process fast and easy, and high enough so that the thermal budget caused by the global heating remains small. Accordingly, the laser reflow process fits well for front-end-of-line (FEOL), middle-end-of-line (MEOL) and back-end-of-line (BEOL) processes. In accordance with some embodiments, the temperature difference (MP120−Temp124) is in the range between about 100° C. and about 300° C. The heating process using temperature adjusting unit 125 may be started before or simultaneously as the staring time of local heating process 124. Since the wafer 10' has already reached a higher temperature, when the local heating process 124 is started, the temperature of trench-filling material 120 is already closer to the melting point MP120, and hence the reflow process is easier.

In accordance with alternative embodiments, the temperature adjusting unit 125 (a heating unit in accordance with these embodiments), instead of comprising a coil, is also a radiation source configured to heat wafer 10' from the side (for example, the illustrated bottom side) opposite from the side of energy source 126.

In accordance with alternative embodiments, temperature adjusting unit 125 is a cooling unit, and heat-exchanging unit 127 is a cooler, which may be or may include a cooling conduit, in which a coolant such as cooled de-ionized water, cooled oil, cooled air, or the like is conducted. Trench-filling material 120 is cooled by temperature adjusting unit 125 to a temperature lower than room temperature (for example, lower than 21° C.). Since the cooling is a global cooling process for cooling the entire wafer 10', the temperatures of protruding fins 113 and surface regions 116 are also lowered when local heating process 124 is started. In accordance with some embodiments, the cooling reduces the temperature of wafer 10' by about 50° C. to about 100° C. The cooling process using temperature adjusting unit 125 may be started before (or simultaneously as) the staring time of local heating process since cooling takes longer time than heating. The cooling may prevent surface regions 116 and protruding fins 113 from melting.

FIG. 19 illustrates the resulting trench-filling material 120 after the reflow process 124. In accordance with some embodiments, voids 122 are fully removed due to the mass flow of trench-filling material 120 during the reflow process, and there is no seam left. In accordance with alternative embodiments, seam 128 may exist. The widths W2 and the heights H2 are smaller than the widths W1 and the heights H1 (FIG. 17) of voids 122, respectively. For example, widths W2 may be smaller than about 1 nm, and may be smaller than about 20 percent of widths W1. Experiment results have revealed that the reflow process does not result in noticeable oxidation of trench-filling material 120 due to the short duration of the reflow process. After the reflow process 124, trench-filling material 120 is solidified. The respective process is illustrated as process 310 in the process flow 300 as shown in FIG. 24. The solidification may be achieved by allowing wafer 10' to cool naturally, or may be performed with the assist of temperature adjusting unit 125, which comprises a cooler in accordance with these embodiments.

Figure 21:
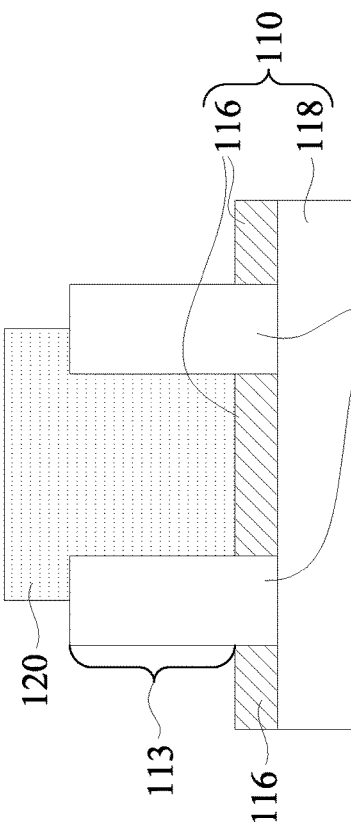
FIGS. 20 and 21 illustrate a plane view and a cross-sectional view, respectively, in the formation of a hard mask filling a trench in accordance with some embodiments.
Figure 20:
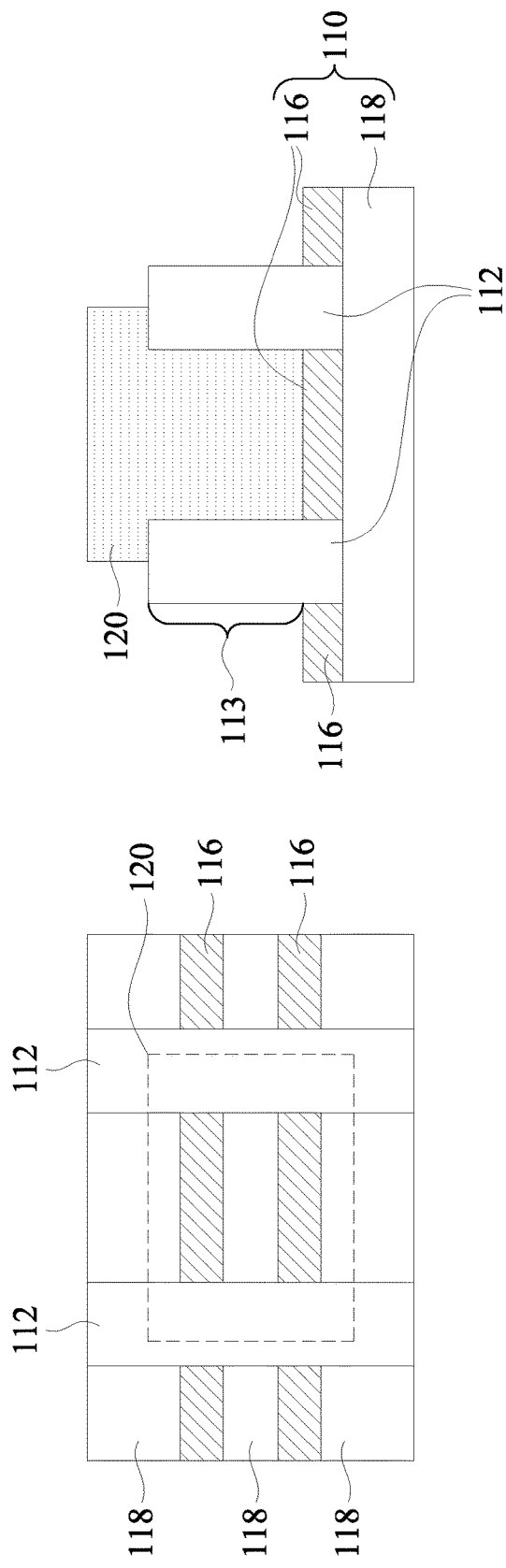

It is appreciated that the trench-filling process including the reflow process may be used for forming other structures. For example, in accordance with some embodiments as shown in FIGS. 20 and 21, surface regions 116 are parts of a conductive or semiconductor layer, which may be formed of doped silicon, aluminum, nickel, or the like. Trench-filling material 120 is a hard mask layer, which may be formed of amorphous silicon, amorphous germanium, silicon-germanium alloy, or the like. Trench-filling material 120 is deposited using the processes as shown in FIGS. 16 through 19, so that the resulting trench-filling material 120 is free or substantially free from voids. Trench-filling material 120 is then patterned, for example, through a lithography process, hence forming the structure as shown in FIGS. 20 and 21. In subsequent process, trench-filling material 120 is used as a hard mask to pattern surface regions 116.

Figure 22:
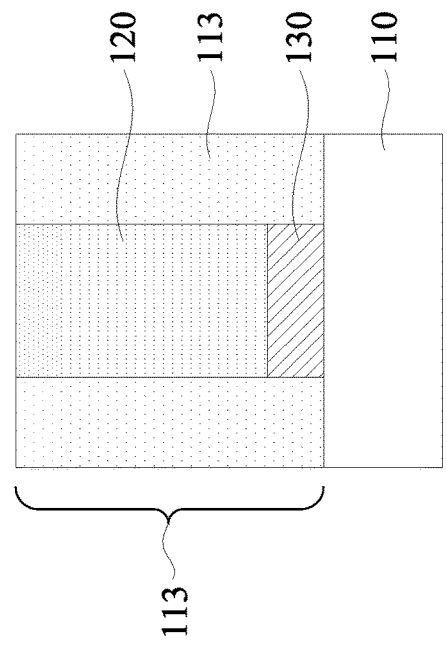
FIG. 22 illustrates a process for filling a conductive via into a trench in accordance with some embodiments.

FIG. 22 illustrates an alternative embodiment in which surface region 130 is a conductive layer such as a silicide region, a metal layer, or the like. Protruding fins 113 may be dielectric fins. Trench-filling material 120 forms a conductive via, which may be formed of or comprise copper or other low-melting-point conductive materials. Trench-filling material 120 is deposited using the processes as shown in FIGS. 16 through 19, and is then patterned, for example, through a lithography process. In these processes, trench-filling material 120 is heated to a temperature higher than the melting point of trench-filling material 120, and lower than the melting point of protruding fins 113 and surface regions 116 to reduce or eliminate voids.

The embodiments of the present disclosure may be applied to other applications, for example, for improving step coverage. For example, the structure shown in FIG. 17 may include a protruding structure (similar to 113) on the left part of FIG. 17, and does not include the protruding structure on the right part of FIG. 17. Trench-filling material 120 in accordance with these embodiments may or may not have voids when trench-filling material 120 is deposited. The reflow process 124, however, may still be performed, so that a first portion of the trench-filling material 120 on top of the protruding structure 113 flows toward a second portion of the trench-filling material 120 on base structure 110. The height difference between the top surfaces of the first portion and the second portion is reduced.

The embodiments of the present disclosure have some advantageous features. By performing a reflow process, the voids in the deposited trench-filling material may be fully eliminated, or significantly reduced. Step coverage may be improved. The process has a low-cost and high throughput.

In accordance with some embodiments of the present disclosure, a method includes forming a first protruding fin and a second protruding fin over a base structure, wherein a trench is located between the first protruding fin and the second protruding fin; depositing a trench-filling material extending into the trench; performing a laser reflow process on the trench-filling material, wherein in the laser reflow process, the trench-filling material has a temperature higher than a first melting point of the trench-filling material, and lower than a second melting point of the first protruding fin and the second protruding fin; after the laser reflow process, allowing the trench-filling material to solidify patterning the trench-filling material, wherein a remaining portion of the trench-filling material forms a part of a gate stack; and forming a source/drain region on a side of the gate stack. In an embodiment, before the reflow process, a void exists in the trench-filling material, and after the reflow process, the void is at least reduced in size. In an embodiment, after the reflow process, the void is eliminated. In an embodiment, the first protruding fin and the second protruding fin are formed of crystal silicon, and the trench-filling material comprises amorphous silicon. In an embodiment, the method further includes, after the trench-filling material is solidified, planarizing the trench-filling material; and patterning the trench-filling material to form a strip. In an embodiment, the method further includes forming gate spacers on sidewalls of the strip; removing the strip to form an additional trench between the gate spacers; and forming a replacement gate stack in the additional trench. In an embodiment, the base structure comprises a surface dielectric region, wherein the trench-filling material contacts the surface dielectric region, and wherein in the reflow process, the temperature of the trench-filling material is further lower than a third melting point of the surface dielectric region. In an embodiment, the method further includes heating or cooling the base structure and the trench-filling material in the reflow process. In an embodiment, the heating or cooling the base structure and the trench-filling material is started before the reflow process is started. In an embodiment, the heating or cooling the base structure and the trench-filling material is started at a same time the reflow process is started.

In accordance with some embodiments of the present disclosure, a method includes forming isolation regions extending into a semiconductor substrate; recessing the isolation regions, so that portions of the semiconductor substrate between the isolation regions protrude higher than the recessed isolation regions to form protruding fins; depositing a silicon region, wherein the silicon region extends into trenches between the protruding fins, and voids are formed in the silicon region; planarizing a top surface of the silicon region, wherein after the planarizing, the voids are sealed in the silicon region; with the voids being sealed in the silicon region, reducing the voids in size; and patterning the silicon region. In an embodiment, the silicon region comprises amorphous silicon. In an embodiment, the reducing the voids in size comprises a reflow process to reflow the silicon region. In an embodiment, the silicon region comprises a first portion higher than bottoms of the voids, and a second portion lower than the bottoms of the voids, and the reflow process results in the first portion to be molten, and the second portion remaining to be solid throughout the reflow process. In an embodiment, in the reflow process, the silicon region is heated to a temperature higher than a first melting temperature of the silicon region, and lower than second melting points of the protruding fins and the isolation regions. In an embodiment, before the reducing the voids in size, the voids are fully sealed inside the silicon region.

In accordance with some embodiments of the present disclosure, a method includes depositing a first material onto a protruding structure and a base layer, wherein the protruding structure protrudes higher than the base layer, and a void is sealed in the first material, and wherein the first material has a first melting point; the protruding structure comprises a second material having a second melting point; and a surface region of the base layer in contact with the first material comprises a third material having a third melting point, and the first melting point is lower than both of the second melting point and the third melting point; and reflowing the first material to eliminate the void, wherein the reflowing is performed by projecting a radiation on the first material. In an embodiment, the radiation comprises a pulse laser. In an embodiment, the radiation is projected on the first material for a period of time shorter than 1 micro second. In an embodiment, both of the first material and the second material comprise silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first protruding fin and a second protruding fin over a base structure;
   depositing a trench-filling material into a trench that is located between the first protruding fin and the second protruding fin, wherein the trench-filling material comprises a metal;
   performing a heating process using a heating source to reflow the trench-filling material;
   at a same time the heating process is performed, adjusting a temperature of the base structure using a temperature-adjusting unit;
   after the heating process, allowing the trench-filling material to solidify; and
   patterning the trench-filling material, wherein a remaining portion of the trench-filling material forms a part of a gate stack.

2. The method of claim 1, wherein in the heating process, an upper part of the trench-filling material is molten to fill a void in the trench-filling material, and wherein a lower part of the trench-filling material is unmolten.

3. The method of claim 1, wherein in the heating process, an upper part of the trench-filling material is molten to fill a void in the trench-filling material, and wherein a lower part of the trench-filling material is partially molten.

4. The method of claim 1, wherein before the heating process, a void is located between the first protruding fin and the second protruding fin, and wherein after the heating process, a volume of the void is reduced.

5. The method of claim 4, wherein at a time before the heating process, the void has a top end that is opened to outside of the trench-filling material.

6. The method of claim 4, wherein at a time before the heating process, the void is fully enclosed by the trench-filling material.

7. The method of claim 4, wherein at a time after the heating process, the void is reduced in widths, with a seam left.

8. The method of claim 1, wherein the heating source is over the base structure, and the temperature-adjusting unit is under the base structure.

9. The method of claim 1, wherein the adjusting the temperature of the base structure comprises heating the base structure from bottom of the base structure.

10. The method of claim 1, wherein the adjusting the temperature of the base structure comprises cooling the base structure from bottom of the base structure.

11. A method comprising:
    forming isolation regions extending into a semiconductor region of a wafer;
    recessing the isolation regions, so that portions of the semiconductor region protrude higher than the isolation regions to form protruding fins;
    depositing a filling material, with a portion of the filling material filled between the protruding fins, wherein a void is formed in the filling material; and
    reducing the void in size by reflowing the filling material, wherein the reducing the void comprises:
      heating the filling material using an energy source, wherein the energy source is on a first side of the wafer; and
      cooling the semiconductor region using a temperature-adjusting unit, wherein the temperature-adjusting unit is on a second side of the wafer, and wherein the cooling using the temperature-adjusting unit is started at a time before the heating the filling material using the energy source is started.

12. The method of claim 11, wherein the temperature-adjusting unit is configured to reduce a temperature of the wafer by a temperature difference in a range between about 50° C. and about 100° C.

13. The method of claim 11, wherein before the reducing the void in size, the void is fully sealed inside the filling material.

14. A method comprising:
depositing a material onto a protruding structure and a base layer of a wafer, wherein the protruding structure protrudes higher than the base layer, and a void is sealed in the material;
reflowing the material to reduce a volume of the void, wherein the reflowing is performed by projecting a radiation on the material from a first side of the wafer, and wherein when the material is reflowed, a first portion of the material is molten, and a second portion of the material is partially molten, and wherein the second portion of the material that is partially molten comprises liquid portions of the material, and solid portions of the material mixed with the liquid portions of the material; and
at a same time the radiation is projected on the material, adjusting a temperature of the base layer and the protruding structure using a temperature-adjusting unit, wherein the temperature-adjusting unit is on a second side of the wafer.

15. The method of claim 14, wherein the material comprises silicon.

16. The method of claim 14, wherein the void comprises a top portion higher than a top end of the protruding structure, and a lower portion lower than the top end of the protruding structure.

17. The method of claim 14, wherein the temperature-adjusting unit comprises a cooling unit, and the adjusting the temperature comprises cooling.

18. The method of claim 11, wherein at a time the reflowing the filling material is performed, both of the heating the filling material using the energy source and the cooling the semiconductor region using the temperature-adjusting unit are performed.

19. The method of claim 11, wherein the cooling the semiconductor region using the temperature-adjusting unit comprises conducting a coolant into a conduit in the temperature-adjusting unit, wherein the coolant has a temperature lower than room temperature.

20. The method of claim 11, wherein the filling material comprises silicon.

* * * * *